(12) United States Patent
Cha et al.

(10) Patent No.: US 11,515,380 B2
(45) Date of Patent: Nov. 29, 2022

(54) DISPLAY DEVICE WITH OVERLAPPING AUXILIARY LINES IN NON-DISPLAY AREA SURROUNDING TRANSMISSION AREA

(71) Applicant: SAMSUNG DISPLAY CO., LTD., Yongin-si (KR)

(72) Inventors: Seungji Cha, Yongin-si (KR); Wonkyu Kwak, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 245 days.

(21) Appl. No.: 16/882,897

(22) Filed: May 26, 2020

(65) Prior Publication Data

US 2021/0159300 A1     May 27, 2021

(30) Foreign Application Priority Data

Nov. 25, 2019   (KR) .......................... 10-2019-0152598

(51) Int. Cl.
*H01L 27/32*     (2006.01)

(52) U.S. Cl.
CPC ...... *H01L 27/3276* (2013.01); *H01L 27/3248* (2013.01)

(58) Field of Classification Search
CPC ...................... H01L 27/3276; H01L 27/3248
See application file for complete search history.

(56) References Cited

U.S. PATENT DOCUMENTS

| | | | |
|---|---|---|---|
| 10,134,826 B2 * | 11/2018 | Ka | H01L 51/56 |
| 10,476,032 B2 | 11/2019 | Park et al. | |
| 2010/0053058 A1 * | 3/2010 | Nagashima | G09G 3/36 345/98 |
| 2011/0084955 A1 | 4/2011 | Kim | |
| 2017/0162637 A1 * | 6/2017 | Choi | H01L 51/5237 |
| 2017/0294502 A1 * | 10/2017 | Ka | H01L 27/3258 |
| 2019/0051670 A1 * | 2/2019 | Bei | H01L 27/3276 |
| 2019/0123066 A1 * | 4/2019 | Zhan | H01L 27/1218 |
| 2020/0168633 A1 | 5/2020 | Ina et al. | |
| 2020/0273884 A1 * | 8/2020 | Tsai | H01L 27/124 |

FOREIGN PATENT DOCUMENTS

| | | |
|---|---|---|
| CN | 107977114 | 5/2018 |
| CN | 108417172 | 8/2018 |
| CN | 108803160 | 11/2018 |
| CN | 108806513 | 11/2018 |
| CN | 109119447 | 1/2019 |

(Continued)

OTHER PUBLICATIONS

European Search Report dated Jan. 28, 2021 in related European Patent Application No. 20188527.4 (8 pages).

*Primary Examiner* — Lex H Malsawma

(74) *Attorney, Agent, or Firm* — F. Chau & Associates, LLC

(57) ABSTRACT

A display device includes a first data line extending in a first direction, arranged in a display area, and connected to a first display element; a second data line extending in the first direction, arranged in the display area, and connected to a second display element; an auxiliary line arranged in a first non-display area and connecting the first data line to the second data line; and a plurality of patterns arranged apart from the auxiliary line in surroundings of the auxiliary line in the first non-display area.

22 Claims, 28 Drawing Sheets

(56) References Cited

FOREIGN PATENT DOCUMENTS

| | | |
|---|---|---|
| CN | 111123597 | 5/2020 |
| KR | 10-2011-0039773 | 4/2011 |
| KR | 10-2019-0080584 | 7/2019 |
| KR | 10-2019-0084194 | 7/2019 |
| WO | 2019009184 | 1/2019 |

\* cited by examiner

DISPLAY DEVICE WITH OVERLAPPING AUXILIARY LINES IN NON-DISPLAY AREA SURROUNDING TRANSMISSION AREA

CROSS-REFERENCE TO RELATED APPLICATION

This application claims priority under 35 U.S.C. § 119 to Korean Patent Application No. 10-2019-0152598, filed on Nov. 25, 2019, in the Korean Intellectual Property Office, the disclosure of which is incorporated by reference herein in its entirety.

BACKGROUND

1. Field

The present invention relates to a display device, and more particularly, to a display device including a transmission area.

2. Description of Related Art

Recently, display devices have been used in various fields. In consumer electronics, display devices are desirable to be thin and lightweight.

Display devices have been developed to have a larger display area with more functions that may be combined or associated with the display devices. To add various functions while increasing the display area, research on display devices including an area for adding various functions instead of displaying an image in a display area is in constant progress.

SUMMARY

One or more embodiments include a display device including a transmission area inside a display area, the transmission area being an area for adding various functions and for transmitting light. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments of the disclosure.

According to an exemplary embodiment, a display device includes a substrate including a transmission area, a display area, and a first non-display area, the display area surrounding the transmission area, and the first non-display area being between the transmission area and the display area, a first display element and a second display element arranged apart from each other in the display area with the transmission area therebetween, a first data line extending in a first direction, arranged in the display area, and connected to the first display element, a second data line extending in the first direction, arranged in the display area, and connected to the second display element, an auxiliary line arranged in the first non-display area and connecting the first data line to the second data line, and patterns arranged apart from the auxiliary line in surroundings of the auxiliary line in the first non-display area.

According to an exemplary embodiment, a display device includes a substrate including a transmission area, a display area, and a first non-display area, the display area surrounding the transmission area, and the first non-display area being between the transmission area and the display area, a first display element and a second display element arranged apart from each other in the display area with the transmission area therebetween, a first data line extending in a first direction, arranged in the display area, and connected to the first display element, a second data line extending in the first direction, arranged in the display area, and connected to the second display element, and an auxiliary line arranged in the first non-display area and connecting the first data line to the second data line, wherein the auxiliary line includes a first portion, a second portion, a third portion, and a branch, the first portion and the second portion being parallel to the first direction, the third portion connecting the first portion to the second portion and extending along an edge of the transmission area, and the branch protruding and extending from the third portion to a direction facing the third portion.

According to an exemplary embodiment, a display device including a display area and a transmission area therein includes a display layer disposed on a substrate and in the display area, and a transmission hole penetrating the display layer and disposed in the transmission area. The display layer includes a pixel-free region and a first region having a plurality of pixels. The pixel-free region surrounds the transmission hole and is interposed between the first region and the transmission hole. A first pixel and a second pixel are spaced apart from each other in the first region with the transmission hole therebetween. The display layer further includes a first data line having a first auxiliary line disposed in the pixel-free region, and a first sub-data line and a second sub-data line in the first region, the first sub-data line and the second sub-data line extending in a first direction and connected to the first pixel and the second pixel, respectively, the first auxiliary line connecting the first sub-data line to the second sub-data line, and patterns arranged in the pixel-free region and spaced apart from the first auxiliary line.

According to an exemplary embodiment of the present invention, a display device including a display area and a transmission area therein, includes a display layer on a substrate and in the display area, and a transmission hole penetrating the display layer and disposed in the transmission area. The display layer includes a pixel-free region and a first region having a plurality of pixels. The pixel-free region surrounds the transmission hole and is interposed between the first region and the transmission hole. A first pixel and a second pixel are spaced apart from each other in the first region with the transmission hole therebetween. The display layer further includes a first data line having a first auxiliary line disposed in the pixel-free region, and a first sub-data line and a second sub-data line disposed in the first region, the first sub-data line and the second sub-data line extending in a first direction and connected to the first pixel and the second pixel, respectively, and the first auxiliary line connecting the first sub-data line to the second sub-data line. The first auxiliary line includes a first portion, a second portion, a third portion, and a first branch, the first portion and the second portion being parallel to the first direction, the third portion connecting the first portion to the second portion and extending along an edge of the transmission area, and the first branch extending from a portion where the first portion is connected to the third portion along a first extending direction of the third portion.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
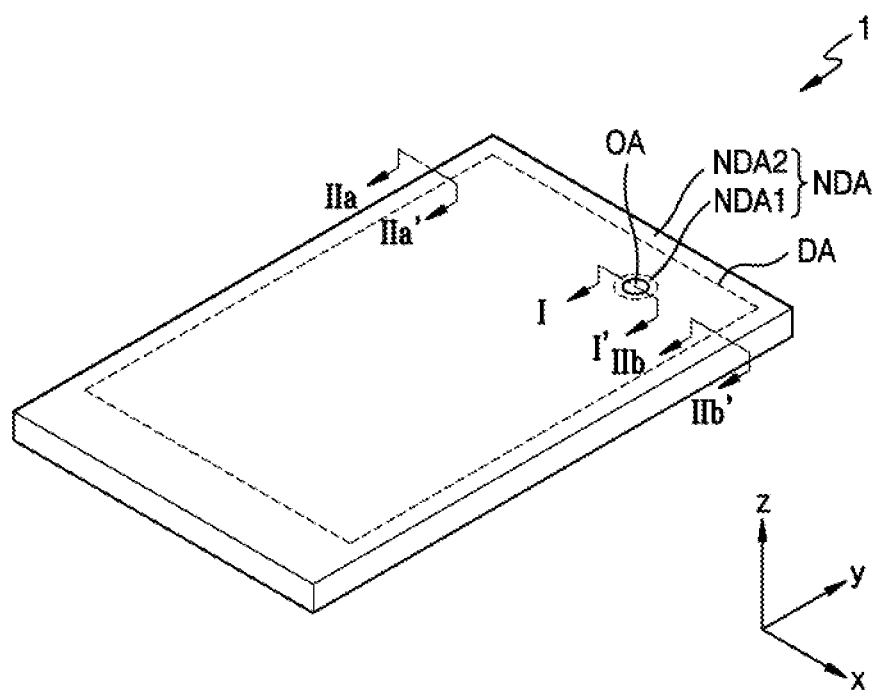
FIG. 1 is a perspective view of a display device according to an exemplary embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, the present embodiments are described in detail with reference to the accompanying drawings. In the drawings, the same reference numerals are given to the same or corresponding elements, and repeated description thereof is omitted.

It will be understood that although the terms "first," "second," etc. may be used herein to describe various elements, these components should not be limited by these terms. These terms are only used to distinguish one element from another.

As used herein, the singular forms "a," "an," and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on," another layer, region, or element, it can be directly or indirectly formed on the other layer, region, or element. For example, intervening layers, regions, or element s may be present.

Sizes of elements in the drawings may be exaggerated or reduced for convenience of explanation. In other words, since sizes and thicknesses of elements in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the present specification, "A and/or B" means A or B, or A and B. In the present specification, "at least one of A and B" means A or B, or A and B.

It will be understood that when a layer, region, or element is referred to as being "connected" to another layer, region, or element, it may be "directly connected" to the other layer, region, or element and/or may be "indirectly connected" to the other layer, region, or element with other layer, region, or element interposed therebetween. For example, it will be understood that when a layer, region, or element is referred to as being "electrically connected" to another layer, region, or element, it may be "directly electrically connected" to the other layer, region, or element and/or may be "indirectly electrically connected" to other layer, region, or element with other layer, region, or element interposed therebetween.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that when a wiring is referred to as being extend in a first direction or a second direction, it may extend not only in a straight line shape but also in zigzags or a curve in the first direction or the second direction.

It will be understood that when referred to as "planar", it means when an object is viewed from above, and when referred to as "cross-section", it means when an object is viewed from a side of the cross section of the object cut vertically. It will be understood that when a first element is referred to as overlapping a second element, it means that the first element is located above or below the second element.

FIG. 1 is a perspective view of a display device 1 according to an embodiment.

Referring to FIG. 1, the display device 1 may include a display area DA and a non-display area (i.e., a pixel-free area) NDA, the display area DA emitting light, and the non-display area NDA not emitting light. The display device 1 may provide a predetermined image by using light emitted from a plurality of pixels arranged in the display area DA.

The display device 1 may include a component area OA. The component area OA may be at least partially surrounded by the display area DA. For example, as shown in FIG. 1, the component area OA may be entirely surrounded by the display area DA.

The non-display area NDA may include a first non-display area NDA1 and a second non-display area NDA2, the first non-display area NDA1 surrounding the component area OA, and the second non-display area NDA2 surrounding the display area DA. For example, the first non-display area NDA1 may entirely surround the component area OA, the display area DA may entirely surround the first non-display area NDA1, and the second non-display area NDA2 may entirely surround the display area DA.

Figure 2A:
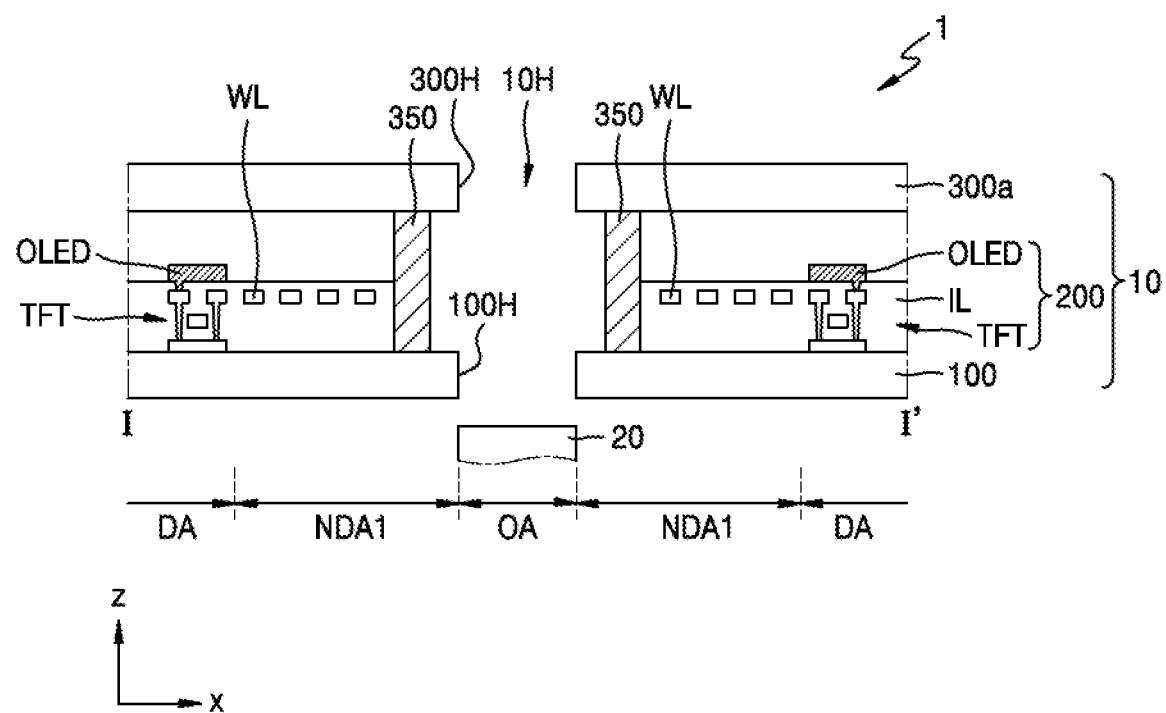
FIGS. 2A to 2D are cross-sectional views of a display device according to exemplary embodiments.

The component area OA may be an area in which a component described below with reference to FIG. 2A is arranged. The component area OA may be a transmission area through which light and/or sound that is output from the component to the outside or propagates toward the component from the outside, may pass. In an embodiment, in the case where light passes through the component area OA, a transmittance of the component area OA may be 50% or more. In an example embodiment, the transmittance may be 70% or more, 75% or more, 80% or more, 85% or more, or 90% or more.

Hereinafter, the display device 1 according to an embodiment is described as an organic light-emitting display device. The display device 1 according to an embodiment is not limited thereto. In an exemplary embodiment, the display device 1 may be various types of display devices such as inorganic light-emitting displays and quantum dot light-emitting displays. For example, an emission layer of a display element (i.e., a pixel) provided to the display device 1 may include an organic material, include an inorganic material, include quantum dots, include an organic material and quantum dots, or include an inorganic material and quantum dots.

In FIG. 1, the component area OA is arranged closer to one side (e.g., an upper right side) of the display area DA, which has a quadrangular shape. The present invention is not limited thereto. In an exemplary embodiment, the shape of the display area DA may be a circle, an ellipse, or a polygon such as a triangle or a pentagon. In an exemplary embodiment, the location of the component area OA may be variously changed. For example, the component area OA may be arranged closer to a central top side of a plane (e.g. an x-y plane) of the display area DA.

FIGS. 2A to 2D are cross-sectional views of the display device 1 according to embodiments. For example, FIGS. 2A to 2D may correspond to cross-sections of the display device 1 taken along line I-I' of FIG. 1.

Referring to FIG. 2A, the display device 1 may include a display panel 10 and a component 20. The display panel 10 may include display elements. The component 20 is located in the component area OA.

The display panel 10 may include a substrate 100, an encapsulation substrate 300a, and a display layer 200. The encapsulation substrate 300a may be an encapsulation member spaced apart from the substrate 100, and the display layer 200 may be arranged between the substrate 100 and the encapsulation substrate 300a. A sealing material 350 (sealant) may be arranged between the substrate 100 and the encapsulation substrate 300a, the sealing material 350 covering a lateral surface of the display layer 200. In FIG. 2A, the sealing material 350 is arranged on two opposite sides of the component area OA. The component area OA may be entirely surrounded by the sealing material 350 when viewed from a direction perpendicular to a main surface of the substrate 100.

The substrate 100 may include glass or a polymer resin. The polymer resin may include polyethersulfone (PES), polyarylate (PAR), polyetherimide (PEI), polyethylene naphthalate (PEN), polyethylene terephthalate, polyphenylene sulfide (PPS), polyimide (PI), polycarbonate (PC), cellulose tri acetate (TAC), or cellulose acetate propionate (CAP). The substrate 100 including the polymer resin may be flexible, rollable, or bendable. The substrate 100 may have a multi-layered structure including a layer including the polymer resin, and an inorganic layer (not shown). The encapsulation substrate 300a may include glass or the polymer resin.

The display layer 200 may include a circuit layer, an organic light-emitting diode OLED, and an insulating layer IL therebetween, the circuit layer including a thin film transistor TFT, and the organic light-emitting diode OLED being a display element connected to the thin film transistor TFT. The thin film transistor TFT and the organic light-emitting diode OLED connected thereto may be arranged in the display area DA. Some wirings WL of the display layer 200 may be located in the first non-display area NDA1. The wirings WL may provide a predetermined signal or voltage to pixels that are spaced apart from each other with the component area OA therebetween. In FIG. 2A, the wirings WL do not overlap the sealing material 350 in the first non-display area NDA1. The present invention is not limited thereto. In an exemplary embodiment, a portion of the sealing material 350 may overlap the wirings WL. The insulating layer IL may include at least one inorganic insulating layer and/or at least one organic insulating layer.

The display panel 10 may include a through hole 10H corresponding to the component area OA. For example, the substrate 100 and the encapsulation substrate 300a may respectively include sub-through holes 100H and 300H each corresponding to the component area OA. The display layer 200 may include a through hole corresponding to the component area OA. In an exemplary embodiment, the display panel 10 may include the through hole 10H, in the component area OA, having a first sub-through hole 100H penetrating the substrate 100, a second sub-through hole 200H penetrating the display layer 200, and a third sub-through hole 300H penetrating the encapsulation substrate 300a. The second sub-through hole 200H may be defined by the sealing material 350. The first, and second and third sub-through holes 100H, 200H and 300H overlap each other in the component area OA. The first sub-through hole 100H may be connected to the second sub-through hole 200H. The second sub-through hole 200H may be connected to the third sub-through hole 300H.

Elements such as an input sensing member, a reflection prevention member, and a transparent window may be further arranged on the display panel 10, the input sensing member sensing a touch input, and the reflection prevention member including a polarizer and a retarder, or a color filter and a black matrix.

The component 20 may be located in the component area OA. The component 20 may be an electronic element that receives light or sound as an input or generates light or sound as an output. For example, the electronic element may be a sensor such as an infrared sensor that receives light, a camera that receives light and takes an image, a sensor that outputs and senses light or sound to measure a distance or to recognize a fingerprint, a small lamp that outputs light, or a speaker that outputs sound. The component 20 may use light in various wavelength bands such as visible light, infrared light, and ultraviolet light. In the case where the display panel 10 includes the through hole 10H in the component area OA, light or sound that is output or received from the component 20 may be more effectively utilized.

Figure 2B:
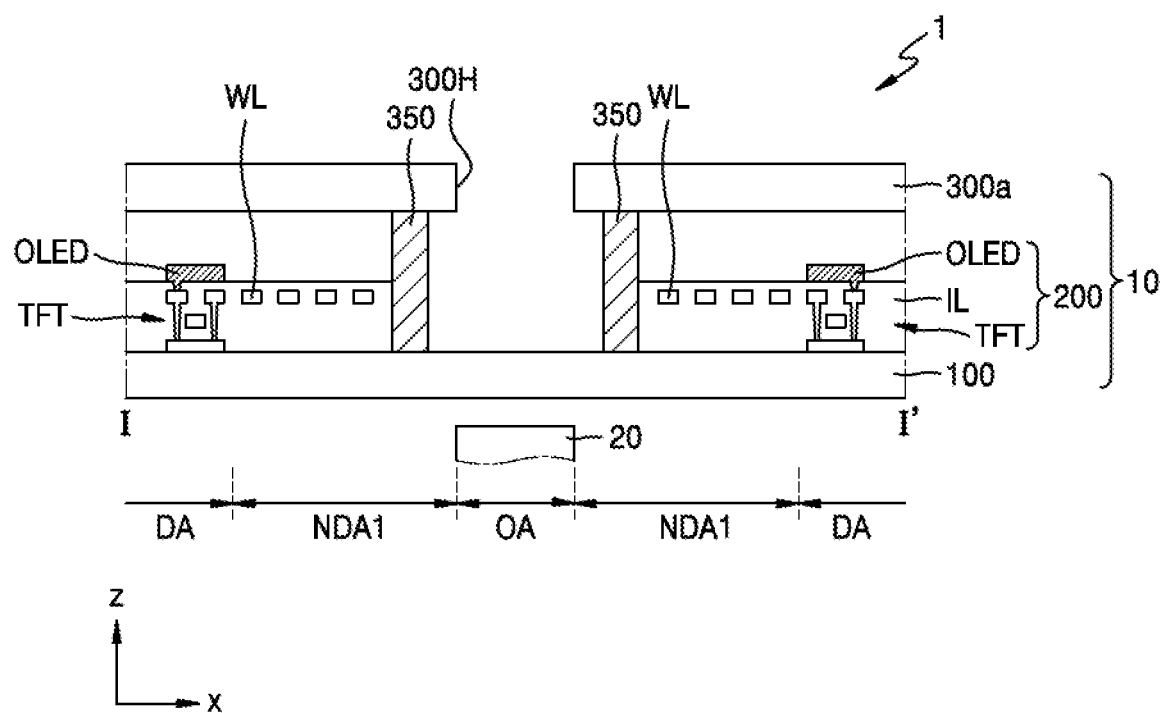

Unlike the display panel 10 including the through hole 10H in the component area OA as shown in FIG. 2A, some elements of the display panel 10 may not include a sub-through hole. For example, as shown in FIG. 2B, the encapsulation substrate 300a includes a sub-through hole 300H corresponding to the component area OA, the substrate 100 may not include a sub-through hole. In an exemplary embodiment, a through hole 10H may include a second sub-through hole 200H penetrating the display layer 200 and a third sub-through hole 300H penetrating the encapsulation substrate 300a.

Figure 2C:
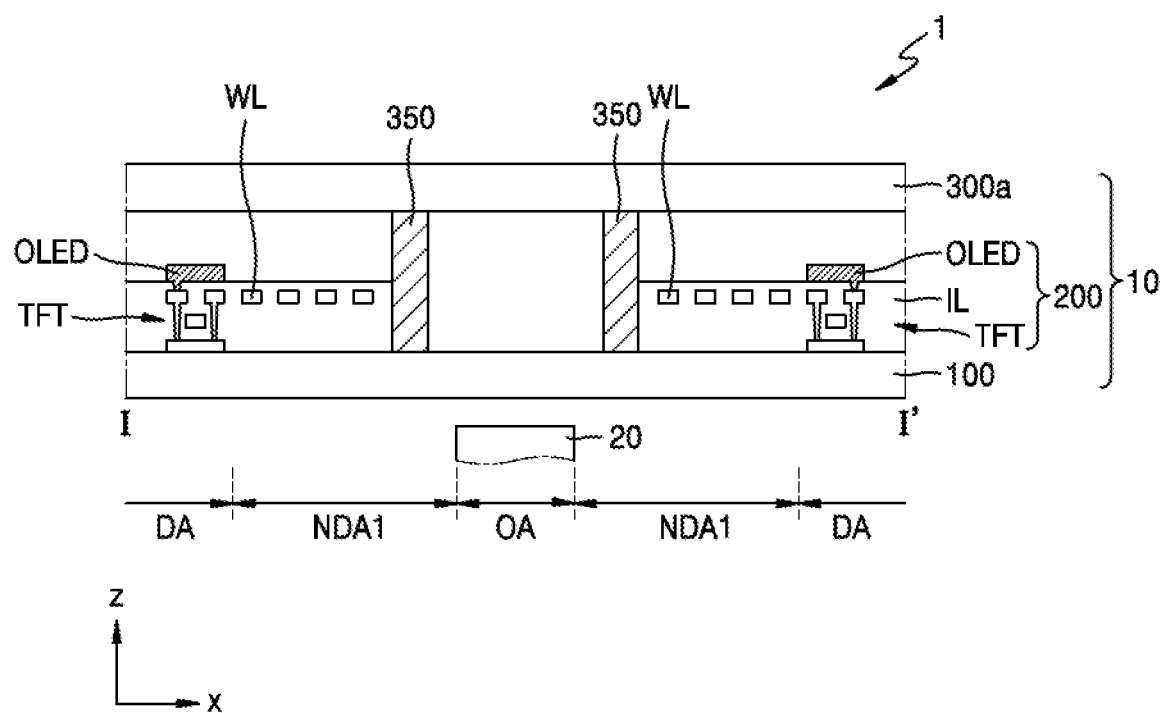
Figure 2D:
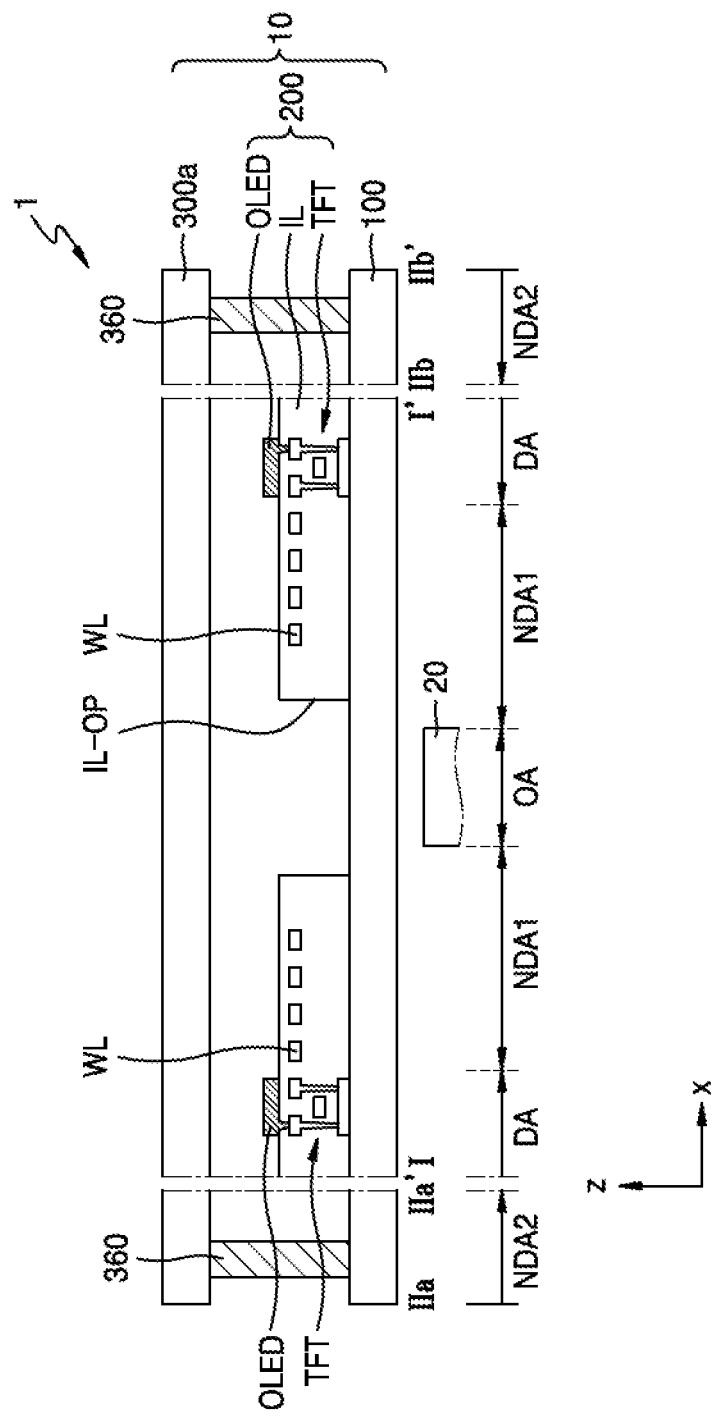

Alternatively, as shown in FIGS. 2C and 2D, both the substrate 100 and the encapsulation substrate 300a may not include a sub-through hole in the component area OA. In FIG. 2C, the sealing material 350 may be arranged in the first non-display area NDA1 and may surround the component area OA. In an exemplary embodiment, a sub-through hole 200H may penetrate the display layer 200. The substrate 100 may cover a bottom of the sub-through hole 200H, and the encapsulation substrate 300a may cover a top of the sub-through hole 200H.

FIG. 2D shows cross-sections of the display device 1 taken along lines IIa-IIa' and IIb-IIb' of FIG. 1. Unlike FIG. 2C, in FIG. 2D, the sealing material 350 may not be provided around the component area OA. Instead, an outside sealing material 360 may be located in the second non-display area NDA2 and may seal the display layer 200 from external air by bonding the substrate 100 to the encapsulation substrate 300a. In an exemplary embodiment, the display device 1 of FIGS. 2A to 2C may also include the outside sealing material 360, as shown in FIG. 2D, to surround the display area DA.

The insulating layer IL of FIG. 2D may include an opening IL-OP corresponding to the component area OA. For example, the opening IL-OP may be formed in the component area OA, penetrating the insulating layer IL to expose a portion of the substrate 100. In an embodiment, any element corresponding to the component area OA may not be arranged between the substrate 100 and the encapsulation substrate 300a. In an exemplary embodiment, a portion of some inorganic insulating layer(s) such as a buffer layer may remain in the component area OA of the substrate 100.

In FIGS. 2A to 2D, the component 20 is located below the display panel 10, that is, on one side of the substrate 100. The present invention is not limited thereto. In an exemplary embodiment, the component 20 may be at least partially inserted and located inside the through hole 10H such that the component 20 overlaps a lateral surface of the display panel 10 that defines the through hole 10H in FIG. 2A.

The component 20 may include another member in addition to the electronic element. In an exemplary embodiment, in the case where the display panel 10 is used as a smart-watch or an instrument panel for an automobile, the component 20 may be a member such as clock hands or a needle indicating predetermined information (e.g. the velocity of a vehicle, etc.). Alternatively, the component 20 may include an element such as an accessory that increases the aesthetic sense of the display panel 10.

Figure 3A:
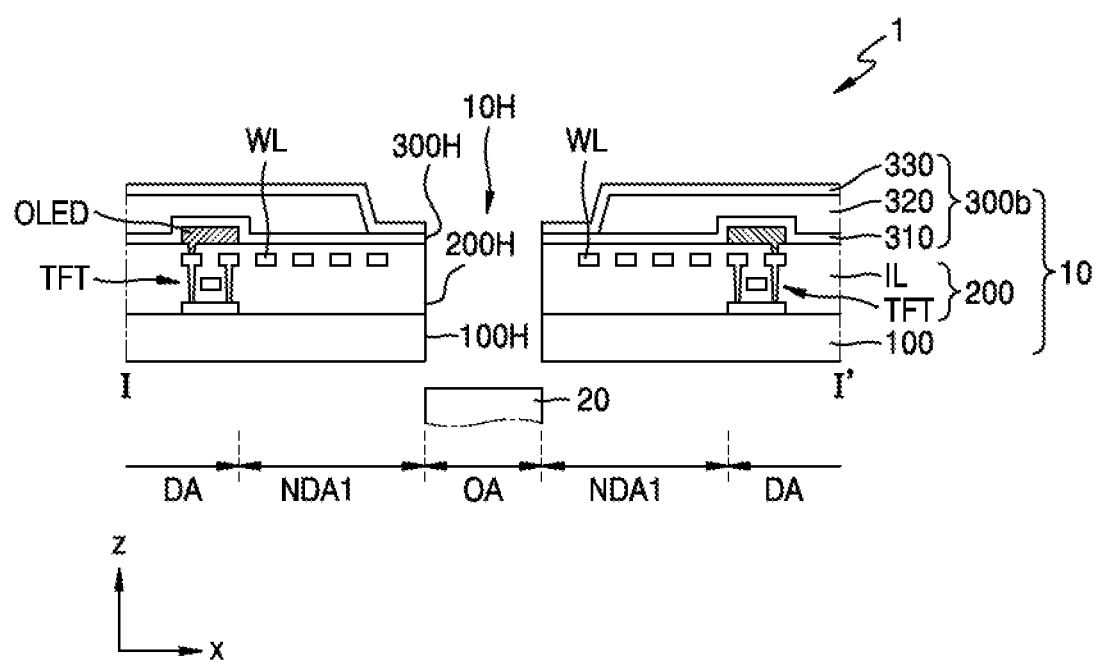
FIGS. 3A to 3C are cross-sectional views of a display device according to exemplary embodiments.
Figure 3B:
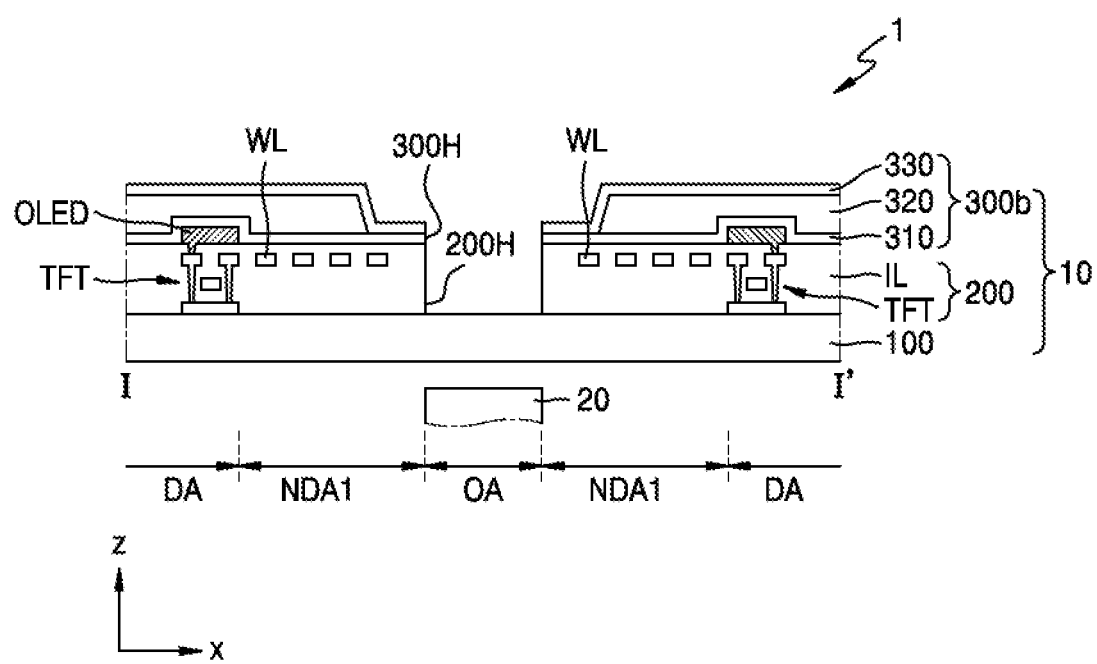
Figure 3C:
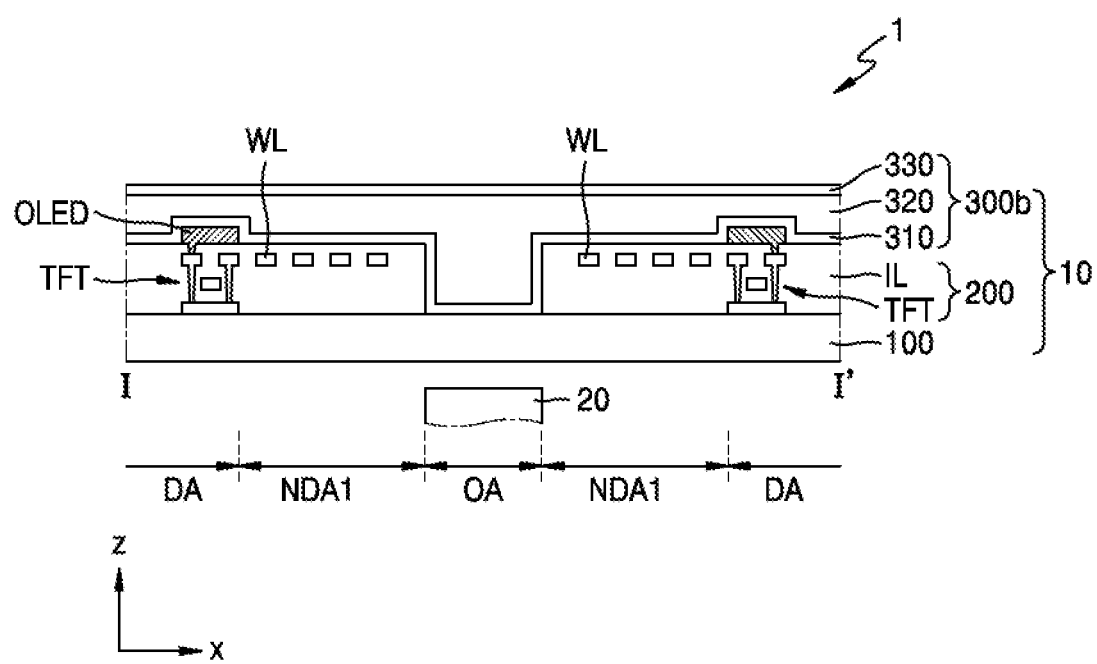

FIGS. 3A to 3C are cross-sectional views of the display device 1 taken along line I-I' of FIG. 1 according to other embodiments.

Referring to FIG. 3A, like the display device 1 described above with reference to FIG. 2A, the display device 1 may include the display panel 10 and the component 20. In addition, the display device 1 may further include an input sensing member, a reflection prevention member, and a window arranged on the display panel 10, the input sensing member sensing a touch input.

Unlike the display panel 10 described above with reference to FIG. 2A including the encapsulation substrate 300a as the encapsulation member, and the sealing material 350, the display panel 10 according to the embodiment may include a thin-film encapsulation layer 300b as the encapsulation member. In the case where the display panel 10 includes the thin-film encapsulation layer 300b as the encapsulation member, the flexibility of the display panel 10 may increase even more. Hereinafter, for convenience of description, differences are mainly described.

The thin-film encapsulation layer 300b may include at least one inorganic encapsulation layer and at least one organic encapsulation layer. For example, as shown in FIG. 3A, the thin-film encapsulation layer 300b may include a first inorganic encapsulation layer 310, a second inorganic encapsulation layer 330, and an organic encapsulation layer 320 therebetween.

The first inorganic encapsulation layer 310 and the second inorganic encapsulation layer 330 may include at least one inorganic insulating material among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, or polyethylene.

The display panel 10 may include the through hole 10H corresponding to the component area OA. For example, the substrate 100, the display layer 200, and the thin-film encapsulation layer 300b may respectively include sub-through holes 100H, 200H, and 300H each corresponding to the component area OA. The thin-film encapsulation layer 300b, for example, the first inorganic encapsulation layer 310, the second inorganic encapsulation layer 330, and the organic encapsulation layer 320 may include a hole corresponding to the component area OA. A size of a hole of the organic encapsulation layer 320 may be greater than sizes of holes of the first and second inorganic encapsulation layers 310 and 330. The first inorganic encapsulation layer 310 may contact the second inorganic encapsulation layer 330 in the surroundings of the component area OA. In an exemplary embodiment, the display panel 10 may include the through hole 10H, in the component area OA, having a first sub-through hole 100H penetrating the substrate 100, a second sub-through hole 200H penetrating the display layer 200, and a third sub-through hole 300H penetrating the encapsulation layer 300b. The second sub-through hole 200H may penetrate the insulating layer IL. The first, and second and third sub-through holes 100H, 200H and 300H overlap each other in the component area OA. The first sub-through hole 100H may be connected to the second sub-through hole 200H. The second sub-through hole 200H may be connected to the third sub-through hole 300H.

Unlike FIG. 3A, a portion of the display panel 10 may not include a sub-through hole. For example, as shown in FIG.

3B, the display layer 200 and the thin-film encapsulation layer 300b may respectively include the sub-through holes 200H and 300H in the component area OA, but the substrate 100 may not include a sub-through hole.

In another example, as shown in FIG. 3C, all of the substrate 100, the display layer 200, and the thin-film encapsulation layer 300b may not include a sub-through hole in the component area OA.

In FIGS. 3B and 3C, the substrate 100 does not include the sub-through hole 100H of FIG. 3A. Since portions of the display layer 200 in the component area OA are at least partially removed, a light transmittance for an electronic element, which is the component 20, may be secured.

In the case where the thin-film encapsulation layer 300b does not include a through hole, each of the at least one inorganic encapsulation layer and the at least one organic encapsulation layer may cover the substrate 100 in the component area OA. A portion of the display layer 200 that is arranged between the substrate 100 and the thin-film encapsulation layer 300b may not cover a portion of the substrate 100 in the component area OA. The portion of the substrate 100 in the component area OA may be covered by the thin-film encapsulation layer 300b.

In FIGS. 3A to 3C, all of the insulating layer IL in the component area OA is removed. The present invention is not limited thereto. In an exemplary embodiment, only a portion of the insulating layer IL having a multi-layered structure in the component area OA may be removed.

In FIGS. 3A to 3C, the component 20 is located below the display panel 10, that is, on one side of the substrate 100. The present invention is not limited thereto. In an exemplary embodiment, the component 20 may be at least partially inserted and located inside the through hole 10H such that the component 20 overlaps a lateral surface of the display panel 10 that defines the through hole 10H in FIG. 3A.

Figure 4:
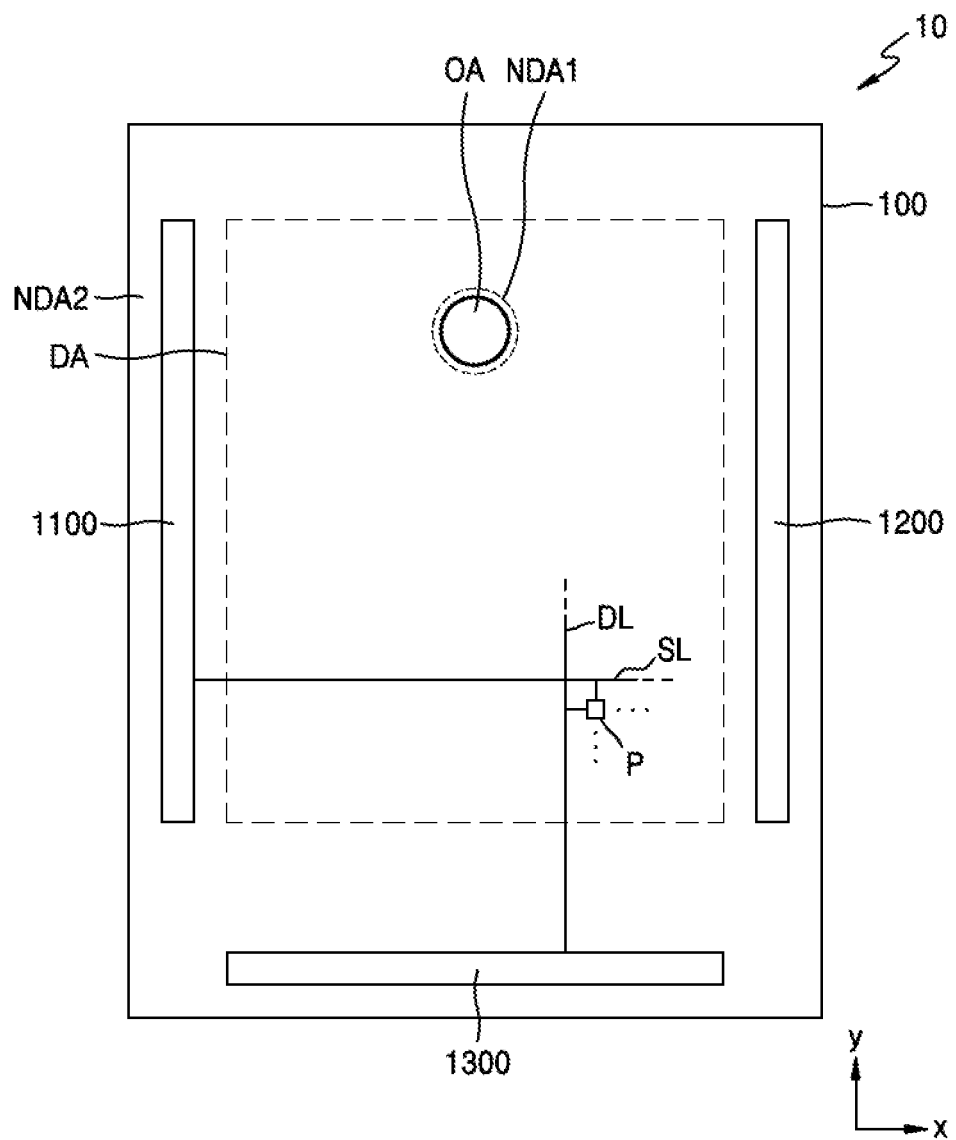
FIG. 4 is a plan view of a display panel according to an exemplary embodiment.

FIG. 4 is a plan view of the display panel 10 according to an embodiment.

The display panel 10 may include a plurality of pixels P arranged in the display area DA. Referring to FIG. 4, a display panel 10 may include a component area OA, a display area DA, a first non-display area NDA1, and a second non-display area NDA2. FIG. 4 illustrates a substrate 100 of the display panel 10, and for example, the substrate 100 may include the component area OA, the display area DA, the first non-display area NDA1, and the second non-display area NDA2.

The first non-display area NDA1 may surround the component area OA in a top down view. The first non-display area NDA1 is an area in which a display element such as an organic light-emitting diode that emits light is not arranged. Signal lines may pass across the first non-display area NDA1, the signal lines providing a signal to pixels P provided around the component area OA. A first scan driver 1100, a second scan driver 1200, a data driver 1300, and a main power line (not shown) may be arranged in the second non-display area NDA2, the first scan driver 1100 and the second scan driver 1200 providing a scan signal to each pixel P, the data driver 1300 providing a data signal to each pixel P, and the main power line providing a first power voltage and a second power voltage. The first scan driver 1100 and the second scan driver 1200 each may be arranged in the second non-display area NDA2 and arranged on two opposite sides of the display area DA with the display area DA therebetween. The first scan driver 1100, the second scan driver 1200, and the data driver 1300 may be arranged outside the outside sealing material 360 (see FIG. 2D) arranged in the second non-display area NDA2.

In FIG. 4 that the data driver 1300 is adjacent to one side of the substrate 100. The present invention is not limited thereto. In an exemplary embodiment, the data driver 1300 may be arranged on a flexible printed circuit board (FPCB) electrically connected to a pad arranged on one side of the display panel 10.

Figure 5A:
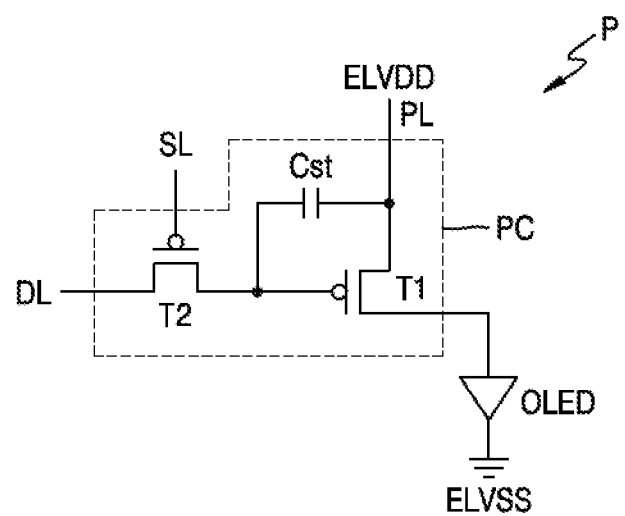
FIGS. 5A and 5B are equivalent circuit diagrams of a pixel arranged on a display panel according to an exemplary embodiment.
Figure 5B:
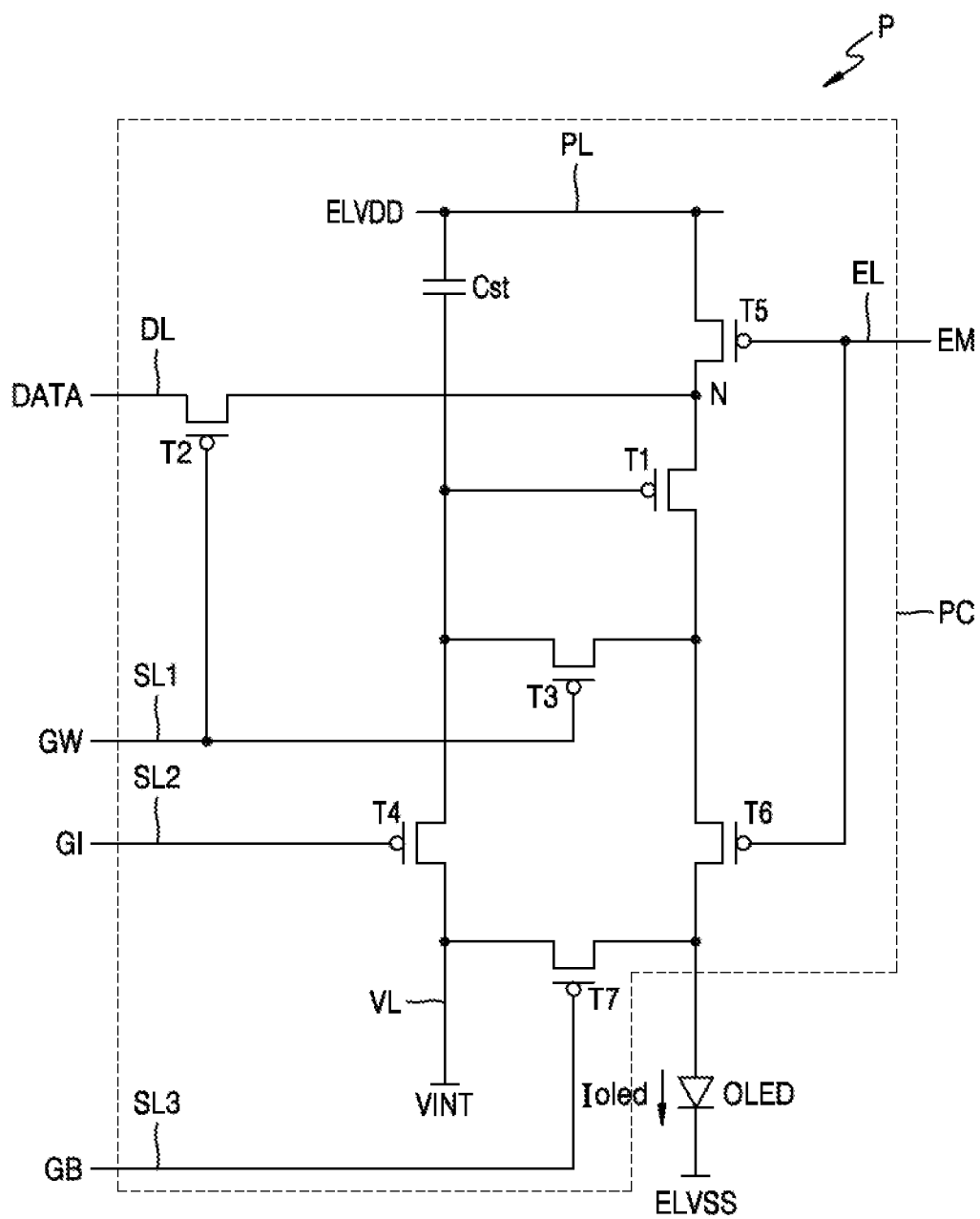

FIGS. 5A and 5B are equivalent circuits of a pixel P arranged on the display panel 10 according to an embodiment.

Referring to FIG. 5A, the pixel P includes a pixel circuit PC and an organic light-emitting diode OLED as a display element connected to the pixel circuit PC. The pixel circuit PC may include a first transistor T1, a second transistor T2, and a capacitor Cst. Each pixel P may emit, for example, red, green, blue, or white light from the organic light-emitting diode OLED. Each of the first transistor T1 and the second transistor T2 may be implemented as a thin film transistor.

The second transistor T2 is a switching transistor, is connected to a scan line SL and a data line DL, and configured to transfer a data signal input from the data line DL to the first transistor T1 according to a switching voltage input from the scan line SL. The capacitor Cst is connected to the second transistor T2 and a power voltage line PL and may store a voltage corresponding to a voltage difference between a voltage of a data signal transferred from the second transistor T2 and a first power voltage ELVDD supplied to the power voltage line PL.

The first transistor T1 is a driving transistor, is connected to the power voltage line PL and the capacitor Cst, and may control a driving current $I_{oled}$ flowing through the organic light-emitting diode OLED from the power voltage line PL in response to the voltage stored in the capacitor Cst. The organic light-emitting diode OLED may emit light having predetermined brightness by using the driving current $I_{oled}$. A common electrode (e.g. a cathode) of the organic light-emitting diode OLED may receive a second power voltage ELVSS.

In FIG. 5A, the pixel circuit PC includes two transistors and one capacitor. The present invention is not limited thereto. The number of transistors and the number of capacitors may be variously modified depending on a design of the pixel circuit PC.

Referring to FIG. 5B, the pixel circuit PC of a pixel P may include first to seventh transistors T1, T2, T3, T4, T5, T6, and T7, and a capacitor Cst. The first to seventh transistors T1, T2, T3, T4, T5, T6, and T7 may be implemented as thin film transistors.

The pixel P may be connected to a first scan line SL1, a second scan line SL2, a third scan line SL3, an emission control line EL, and a data line DL, the first scan line SL1 being configured to transfer a first scan signal GW, the second scan line SL2 being configured to transfer a second scan signal GI, the third scan line SL3 being configured to transfer a third scan signal GB, the emission control line EL being configured to transfer an emission control signal EM, and the data line DL being configured to transfer a data signal DATA. In an embodiment, the third scan line SL3 may be a second scan line SL2 on the next row, and the third scan signal GB may be a second scan signal GI on the next row. For example, a third scan line of a pixel may be shared by another pixel adjacent thereto.

The power voltage line PL is configured to transfer the first power voltage ELVDD to the first transistor T1, and an initialization voltage line VL is configured to transfer an initialization voltage VINT to the pixel P, the initialization voltage VINT initializing the first transistor T1 and the organic light-emitting diode OLED.

In a layout of the pixel circuit PC, the first scan line SL1, the second scan line SL2, the third scan line SL3, the emission control line EL, and the initialization voltage line VL each may extend in an x-direction and be spaced apart from each other in a y-direction different from the x-direction. The data line DL and the power voltage line PL may extend in the y-direction and be apart from each other in the x-direction.

The first transistor T1 is connected to the power voltage line PL through the fifth transistor T5 and electrically connected to the organic light-emitting diode OLED through the sixth transistor T6. The first transistor T1 is a driving transistor and is configured to receive the data signal DATA and supply the driving current $I_{oled}$ to the organic light-emitting diode OLED according to a switching operation of the second transistor T2.

The second transistor T2 is connected to the first scan line SL1 and the data line DL, turned on in response to the first scan signal GW received through the first scan line SL1, and performs a switching operation of transferring the data signal DATA transferred to the data line DL to a node N.

The third transistor T3 is connected to the organic light-emitting diode OLED through the sixth transistor T6. The third transistor T3 is turned on in response to the first scan signal GW transferred through the first scan line SL1 and is configured to diode-connect the first transistor T1.

The fourth transistor T4 is turned on in response to the second scan signal GI transferred through the second scan line SL2 and is configured to initialize a gate voltage of the first transistor T1 by transferring the initialization voltage VINT from the initialization voltage line VL to a gate electrode of the first transistor T1.

The fifth transistor T5 and the sixth transistor T6 are simultaneously turned on in response to an emission control signal EM transferred through the emission control line EL to form a current path such that the driving current $I_{oled}$ flows in a direction from the power voltage line PL to the organic light-emitting diode OLED.

The seventh transistor T7 is turned on in response to a third scan signal GB transferred through the third scan line SL3 and initializes the organic light-emitting diode OLED by transferring the initialization voltage VINT from the initialization voltage line VL to the organic light-emitting diode OLED. The seventh transistor T7 may be omitted. FIG. 5B shows the case where the fourth transistor T4 is connected to the second scan line SL2, and the seventh transistor T7 is separately connected to the third scan line SL3. In an exemplary embodiment, the seventh transistor T7 and the fourth transistor T4 may be simultaneously connected to the second scan line SL2.

Since the capacitor Cst is connected to the power voltage line PL and the gate electrode of the first transistor T1 and stores and maintains a voltage corresponding to a voltage difference between the two voltages, the capacitor Cst may maintain a voltage applied to the gate electrode of the first transistor T1.

The organic light-emitting diode OLED may include a pixel electrode and an opposite electrode. The opposite electrode may receive the second power voltage ELVSS. The organic light-emitting diode OLED displays an image by receiving the driving current $I_{oled}$ from the first transistor T1 and emitting light.

Figure 6:
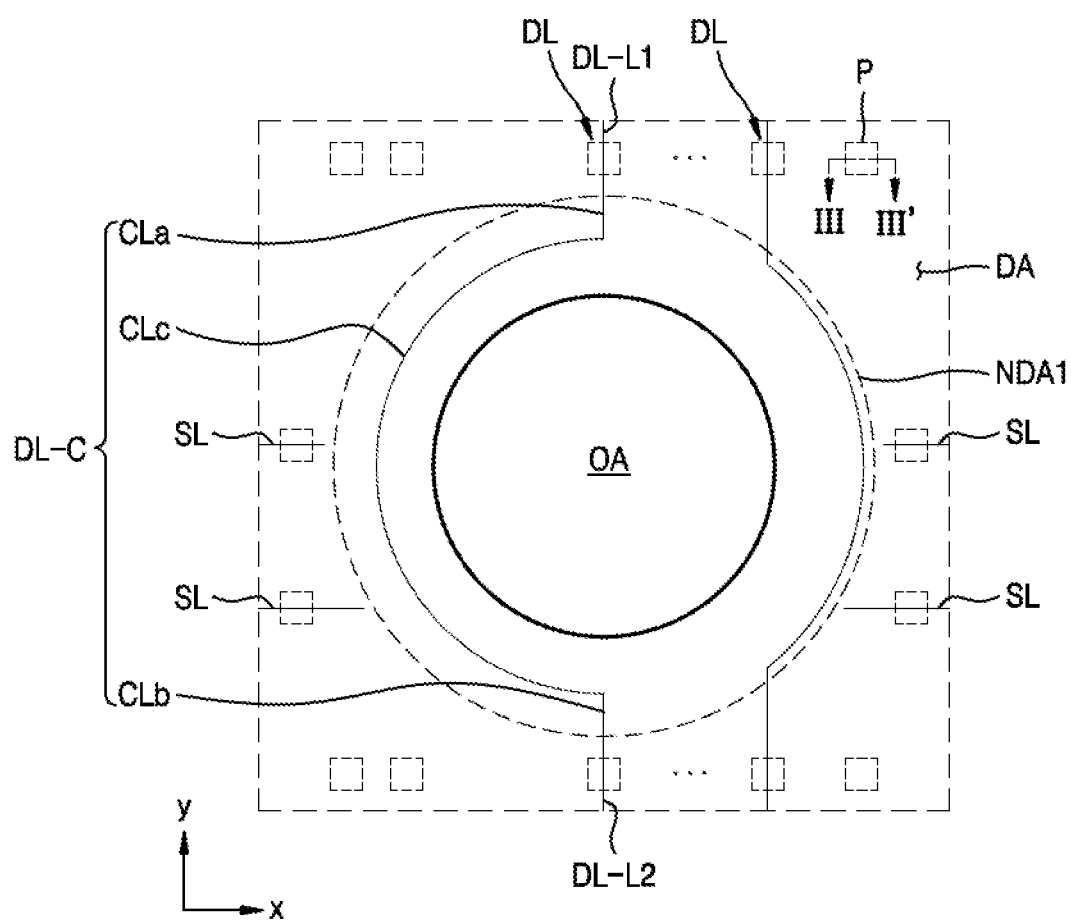
FIG. 6 is a plan view of a portion of a display panel according to an exemplary embodiment.

FIG. 6 is a plan view of a portion of the display panel 10 according to an embodiment.

Referring to FIG. 6, some of the pixels P arranged in the display area DA may be spaced apart from each other around the component area OA. For example, the component area OA may be located between two pixels P arranged in ±x directions of FIG. 6. Similarly, the component area OA may be located between two pixels P arranged in ±y directions of FIG. 6.

The two pixels P on the same column arranged in the ±y directions with the component area OA therebetween (that is, two display elements on the same column) may be electrically connected to the same data line DL. That is, two display elements on the same column arranged in the ±y directions with the component area OA therebetween may be electrically connected to the same data line DL. The data line DL may include a first data line (or a first sub-data line) DL-L1, a second data line (or a second sub-data line) DL-L2, and an auxiliary line DL-C, the first data line DL-L1 and the second data line DL-L2 extending in the ±y directions in the display area DA, and the auxiliary line DL-C extending in an arc direction of the component area OA in the first non-display area NDA1 and connecting the first data line DL-L1 to the second data line DL-L2. For example, the auxiliary line DL-C may extend along a perimeter (i.e., an edge) of the component area OA in the first non-display area NDA1 and connect the first data line DL-L1 to the second data line DL-L2. In an embodiment, the first data line DL-L1, the second data line DL-L2, and the auxiliary line DL-C may be an integrated wiring on a same layer. In an exemplary embodiment, the auxiliary line DL-C may be arranged on a layer different from a layer on which the first data line DL-L1 and the second data line DL-L2 are arranged and may be electrically connected to the first data line DL-L1 and the second data line DL-L2 through contact holes of insulating layers therebetween. The auxiliary line DL-C may be arranged on a layer over the first data line DL-L1 and the second data line DL-L2 or may be arranged on a layer below the first data line DL-L1 and the second data line DL-L2.

The auxiliary line DL-C may be bent in the first non-display area NDA1. The auxiliary line DL-C may include a first portion CLa, a second portion CLb, and a third portion CLc, the third portion CLc connecting the first portion CLa to the second portion CLb. The first portion CLa and the second portion CLb may extend in the ±y directions in the first non-display area NDA1. The third portion CLc may be connected to at an end of the first portion CLa, may extend around an edge of the component area OA, for example, extend in an arc direction of the component area OA, and be connected to an end of the second portion CLb. At the connection between the first portion CLa and the third portion CLc, the extending direction of the auxiliary line DL-C may change, for example, from the ±y directions (the extending direction of the first portion CLa) to the arc direction of the component area OA. At the connection between the second portion CLb and the third portion CLc, the extending direction of the auxiliary line DL-C may change, for example, from the arc direction of the component area OA to the ±y directions (the extending direction of the second portion CLb).

Two pixels P on the same row arranged in the ±x directions with the component area OA therebetween (that is, the two display elements on the same row) may be respectively and electrically connected to different scan lines SL. Scan lines SL on the left of the component area OA may be electrically connected to the first scan driver 1100 (see FIG. 4), and scan lines SL on the right of the component area OA may be electrically connected to the second scan driver 1200 (see FIG. 4). As shown in FIG. 4, in the case where the display panel 10 includes the two scan drivers, pixels P arranged on two opposite sides of the component area OA may be respectively and electrically connected to the scan lines SL spaced apart from each other.

Figure 7:
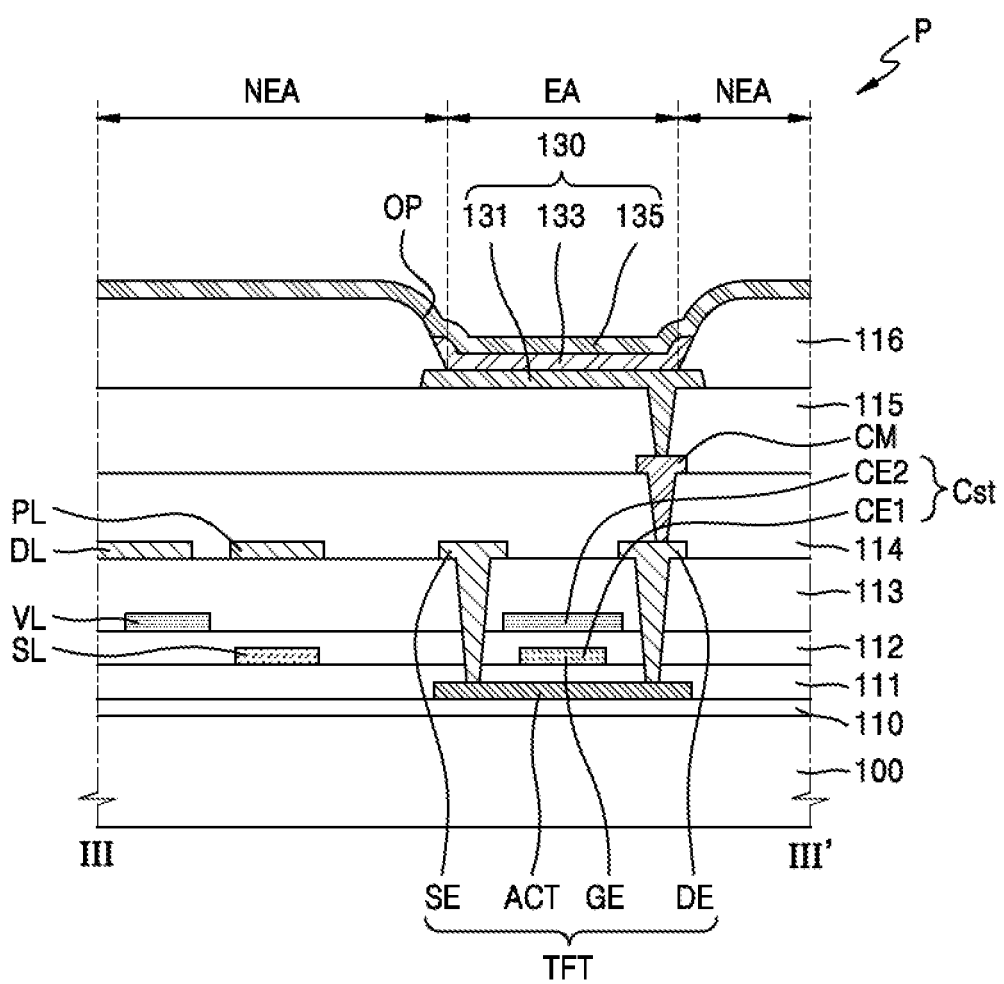
FIG. 7 is a cross-sectional view of the display panel of FIG. 6 taken along line III-III' according to an exemplary embodiment.

FIG. 7 is a cross-sectional view of the display panel 10 taken along line III-III' of FIG. 6. For convenience of description, some circuit elements and some wirings are omitted.

In FIG. 7, a display element 130 may include the organic light-emitting diode OLED of FIG. 5B. A thin film transistor TFT may include one of transistors of FIGS. 5A and 5B. For example, the thin film transistor TFT shown in FIG. 7 may include the first transistor T1 of FIGS. 5A and 5B.

As described above with reference to FIGS. 2A to 3C, the substrate 100 may include glass or a polymer resin. The substrate 100 may include a single layer or a multi-layer.

A buffer layer 110 may be located on the substrate 100. The buffer layer 110 may planarize a surface of the substrate 100 or prevent the penetration of impurities into a semiconductor layer on the buffer layer 110. The buffer layer 110 may include an inorganic insulating material such as silicon nitride, silicon oxynitride, and silicon oxide, and include a single layer or a multi-layer including the inorganic insulating materials. The buffer layer 110 may be omitted.

The thin film transistor TFT may be arranged on the buffer layer 110. The thin film transistor TFT may include a semiconductor layer ACT, a gate electrode GE, a source electrode SE, and a drain electrode DE.

The semiconductor layer ACT may include amorphous silicon, polycrystalline silicon, or an organic semiconductor material. The semiconductor layer ACT may include a source region, a drain region, and a channel region, the channel region being between the source region and the drain region.

The gate electrode GE may include a single layer or a multi-layer including at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

A first insulating layer 111 may be arranged between the semiconductor layer ACT and the gate electrode GE. A second insulating layer 112 and a third insulating layer 113 may be arranged between the gate electrode GE, the source electrode SE, and the drain electrode DE. Each of the first insulating layer 111, the second insulating layer 112, and the third insulating layer 113 may include an inorganic insulating material such as silicon oxide, silicon nitride, and/or silicon oxynitride. The scan lines SL, SL1, SL2, and SL3 and the emission control line EL of FIGS. 5A and 5B may be arranged on the same layer. For example, the scan lines SL, SL1, SL2, and SL3 and the emission control line EL of FIGS. 5A and 5B may be arranged on the first insulating layer 111 on which the gate electrode GE is arranged.

The source electrode SE and the drain electrode DE may be respectively and electrically connected to the source region and the drain region of the semiconductor layer ACT through contact holes formed in the first insulating layer 111, the second insulating layer 112, and the third insulating layer 113.

The source electrode SE and the drain electrode DE may include a single layer or a multi-layer including at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

A capacitor Cst may include a bottom electrode CE1 and a top electrode CE2 overlapping each other with the second insulating layer 112 therebetween. The capacitor Cst may overlap the thin film transistor TFT. It is shown in FIG. 7 that the gate electrode GE of the thin film transistor TFT serves as the bottom electrode CE1 of the capacitor Cst. In an exemplary embodiment, the capacitor Cst may not overlap the thin film transistor TFT, and the bottom electrode CE1 of the capacitor Cst may be an independent element separated from the gate electrode GE of the thin film transistor TFT. The capacitor Cst may be covered by the third insulating layer 113. The initialization voltage line VL of FIG. 5B and the top electrode CE2 may be arranged on the same layer. For example, the initialization voltage line VL of FIG. 5B may be disposed on the second insulating layer 112 on which the top electrode CE2 of the capacitor Cst is arranged.

A pixel circuit including the thin film transistor TFT and the capacitor Cst may be covered by a fourth insulating layer 114 and a fifth insulating layer 115. Each of the fourth insulating layer 114 and the fifth insulating layer 115 is a planarization insulating layer and may include an organic insulating layer. The fourth insulating layer 114 and the fifth insulating layer 115 may include a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. In an embodiment, the fourth insulating layer 114 and the fifth insulating layer 115 may include polyimide.

Various conductive layers may be further arranged on the third insulating layer 113. For example, the data line DL and the power voltage line PL may be arranged on the third insulating layer 113. The source electrode SE and the drain electrode DE may be also arranged on the third insulating layer 113. The data line DL and the power voltage line PL may include molybdenum (Mo), aluminum (Al), copper (Cu), and titanium (Ti) and include a single layer or a multi-layer. In an embodiment, the data line DL and the power voltage line PL may include a multi-layered structure of Ti/Al/Ti.

The fourth insulating layer 114 may be arranged on the data line DL and the power voltage line PL. For example, the fourth insulating layer 114 may cover the data line DL and the power voltage line PL. A connection electrode CM may be arranged on the fourth insulating layer 114. The connection electrode CM may electrically connect a pixel electrode 131 to the source electrode SE or the drain electrode DE of the thin film transistor TFT. The connection electrode CM may include at least one of molybdenum (Mo), aluminum (Al), copper (Cu), and titanium (Ti) and include a single layer or a multi-layer. In an embodiment, the connection electrode CM may include a multi-layered structure of Ti/Al/Ti.

The organic light-emitting diode 130 as the display element may be arranged on the fifth insulating layer 115. The organic light-emitting diode 130 may include the pixel electrode 131, an opposite electrode 135, and an intermediate layer 133 between the pixel electrode 131 and the opposite electrode 135.

The pixel electrode 131 may include a conductive oxide such as indium tin oxide (ITO), indium zinc oxide (IZO), zinc oxide (ZnO), indium oxide ($In_2O_3$), indium gallium oxide (IGO), and aluminum zinc oxide (AZO). In an exemplary embodiment, the pixel electrode 131 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In an exemplary embodiment, the pixel electrode 131 may further include a layer including ITO, IZO, ZnO, or $In_2O_3$ on/under the reflective layer.

A sixth insulating layer 116 may be arranged on the fifth insulating layer 115, the sixth insulating layer 116 covering edges of the pixel electrode 131. The sixth insulating layer 116 may include an opening OP exposing a portion of the pixel electrode 131. The opening (a bottom surface of the opening) of the sixth insulating layer 116 may define an emission area EA. For example, the display area DA may include emission areas EA and a non-emission area NEA between the emission areas EA, the non-emission area NEA surrounding the emission areas EA. The sixth insulating layer 116 may correspond to the non-emission area NEA and include an organic material such as acryl, benzocyclobutene (BCB), polyimide, or hexamethyldisiloxane (HMDSO). Alternatively, the sixth insulating layer 116 may include the inorganic insulating materials such as silicon oxide, silicon nitride, and/or silicon oxynitride.

The intermediate layer 133 may be formed on a portion of the pixel electrode 131 that is exposed by the opening OP of the sixth insulating layer 116. The intermediate layer 133 includes an emission layer. The emission layer may include a polymer organic material or a low molecular weight organic material that emits light having a predetermined color. The emission layer may include a red emission layer, a green emission layer, or a blue emission layer. Alternatively, the emission layer may have a multi-layered structure in which a red emission layer, a green emission layer, and a blue emission layer are stacked to emit white light, or have a single-layered structure including a red emission material, a green emission material, or a blue emission material. In an embodiment, the intermediate layer 133 may include a first functional layer and/or a second functional layer, the first functional layer being arranged under the emission layer, and the second functional layer being arranged on the emission layer. The first functional layer and/or the second functional layer may include a layer which is one body over a plurality of pixel electrodes 131, or include a layer patterned to respectively correspond to the plurality of pixel electrodes 131.

The opposite electrode 135 may be spaced apart from the pixel electrode 131 with the intermediate layer 133 therebetween. The opposite electrode 135 may include a conductive material having a low work function. For example, the opposite electrode 135 may include a (semi)-transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 135 may further include a layer including ITO, IZO, ZnO, or $In_2O_3$ on/under the (semi)-transparent layer including the above-listed materials.

In FIG. 7, the data line DL and the power voltage line PL are arranged on the third insulating layer 113. The present invention is not limited thereto. In an exemplary embodiment, the data line DL and/or the power voltage line PL may be arranged on the same layer of, for example, the fourth insulating layer 114 on which the connection electrode CM is arranged.

Figure 8:
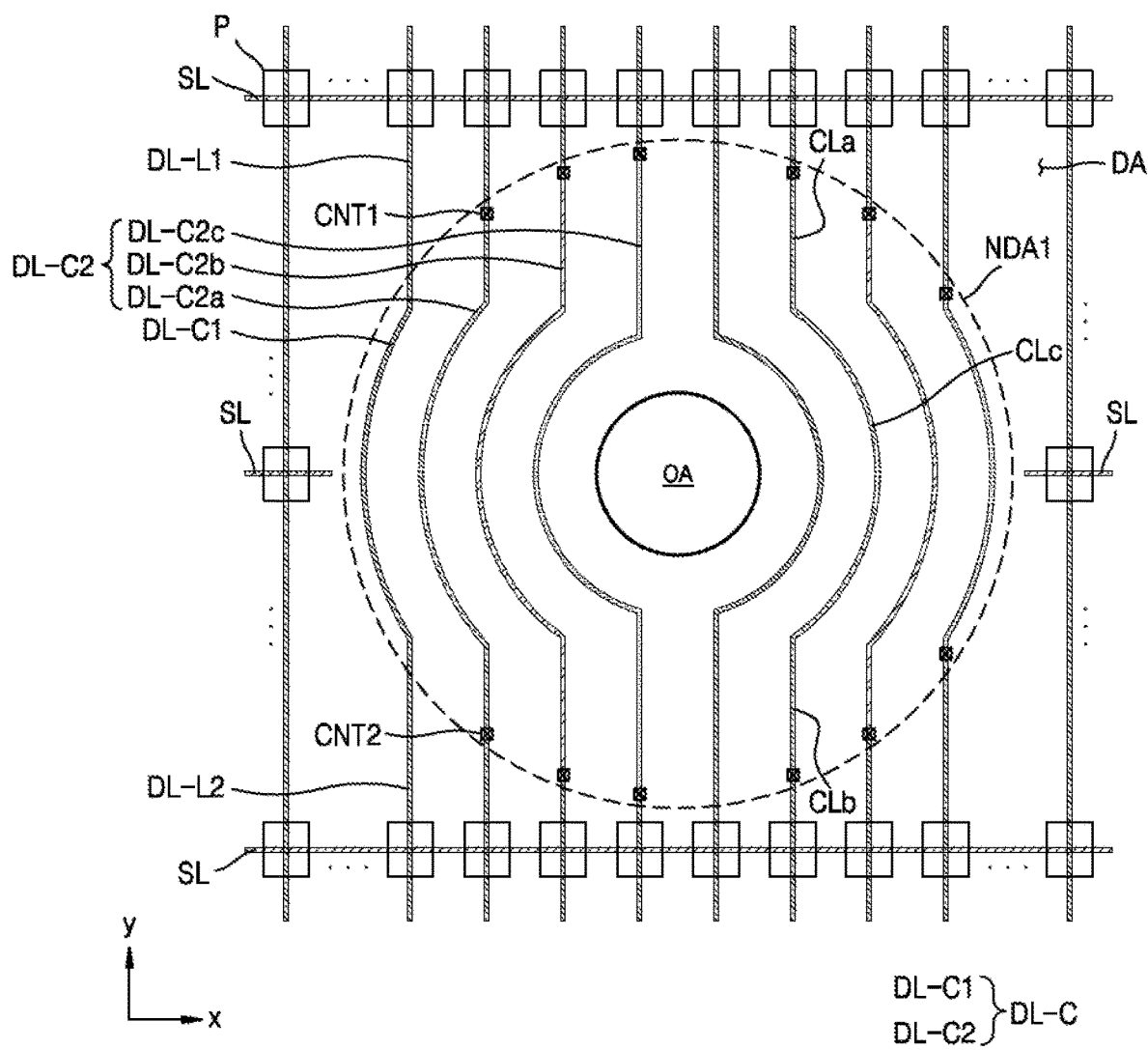
FIG. 8 is a plan view of wirings around a component area according to an exemplary embodiment.

FIG. 8 is a plan view of wirings around the component area OA according to an embodiment. Each of FIGS. 9A to 9D is a cross-sectional view of the display panel taken along the auxiliary line of FIG. 8. For convenience of description, FIG. 8 shows eight auxiliary lines DL-C arranged in the first non-display area NDA1 around the component area OA.

The scan lines SL continuously extending in the ±x directions in the display area DA may be disconnected in the first non-display area NDA1 around the component area OA. In FIG. 8, the scan lines SL are disconnected near a boundary between the display area DA and the first non-display area NDA1. The scan lines SL may be disconnected near the boundary inside the first non-display area NDA1 between the display area DA and the first non-display area NDA1.

The data lines DL continuously extending in the ±y directions in the display area DA may detour the component area OA in the first non-display area NDA1. In an exemplary embodiment, the data lines DL continuously extending in the ±y directions in the display area DA may be disconnected near the boundary between the display area DA and the first non-display area NDA1.

Auxiliary lines DL-C may be arranged in the first non-display area NDA1 as parts of the data lines DL. The auxiliary lines DL-C may include first auxiliary lines DL-C1 and second auxiliary lines DL-C2. The first auxiliary lines DL-C1 and the second auxiliary lines DL-C2 may be alternately arranged in the ±x directions. Each of the first auxiliary lines DL-C1 and the second auxiliary lines DL-C2 may include the first portion CLa, the second portion CLb, and the third portion CLc connecting the first portion CLa to the second portion CLb.

Each of the first auxiliary lines DL-C1 and the second auxiliary lines DL-C2 may be curved to connect the first data line DL-L1 over the component area OA to the second data line DL-L2 below the component area OA. Each of the first auxiliary lines DL-C1 and the second auxiliary lines DL-C2 may be a connection line connecting the first data line DL-L1 to the second data line DL-L2, the connection line being between the first data line DL-L1 and the second data line DL-L2.

Figure 9A:
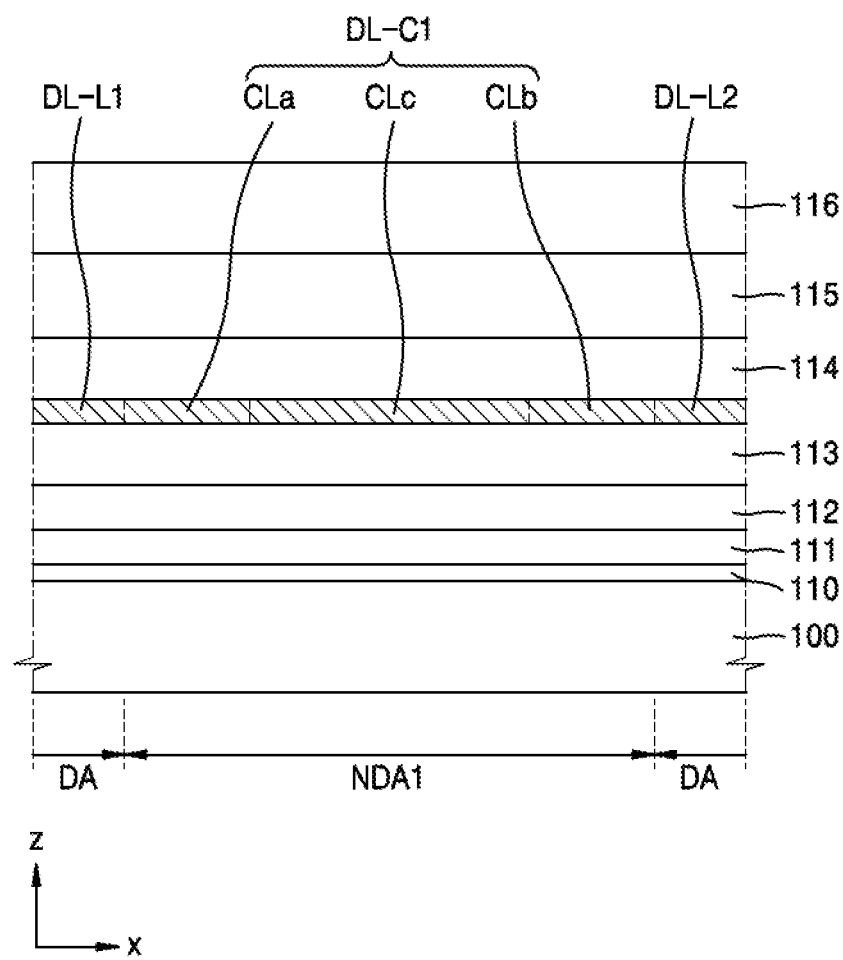
FIGS. 9A to 9D are cross-sectional views of display panel of FIG. 8 taken along an auxiliary line according to an exemplary embodiment.

The first auxiliary line DL-C1 may be formed as one body with the first data line DL-L1 and the second data line DL-L2. FIG. 9A is a cross-sectional view of the first auxiliary line DL-C1. As shown in FIG. 9A, the first auxiliary line DL-C1 may include the first portion CLa connected to an end portion of the first data line DL-L1 and the second portion CLb connected to an end portion of the second data line DL-L2 of the display area DA. For convenience of description, dashed lines are marked as a boundary between the first data line DL-L1 and the first portion CLa, a boundary between the first portion CLa and the third portion CLc, a boundary between the third portion CLc and the second portion CLb, and a boundary between the second portion CLb and the second data line DL-L2. Those boundaries do not exist in the integrated wiring of the DL-L1, DL-C1 and DL-L2. For example, the first data line DL-L1, the second data line DL-L2, and the first auxiliary line DL-C1 may be arranged on the same layer of the third insulating layer 113. The first auxiliary line DL-C1 may include the same material as those of the first data line DL-L1 and the second data line DL-L2. In an embodiment, the first data line DL-L1, the second data line DL-L2, and the first auxiliary line DL-C1 may be arranged on the third insulating layer 113. In an exemplary embodiment, the first data line DL-L1, the second data line DL-L2, and the first auxiliary line DL-C1 may be arranged on the fourth insulating layer 114.

The second auxiliary line DL-C2 may include a wiring arranged on a layer different from a layer on which the first data line DL-L1 and the second data line DL-L2 are arranged, the wiring being electrically connected to the first data line DL-L1 and the second data line DL-L2. The second auxiliary line DL-C2 may include a (2-1) auxiliary line DL-C2a, a (2-2) auxiliary line DL-C2b, and a (2-3) auxiliary line DL-C2c. The (2-1) auxiliary line DL-C2a, the (2-2) auxiliary line DL-C2b, and the (2-3) auxiliary line DL-C2c may be respectively arranged on different layers. The (2-1) auxiliary line DL-C2a, the (2-2) auxiliary line DL-C2b, and the (2-3) auxiliary line DL-C2c may be arranged on layers different from a layer on which the first auxiliary line DL-C1 is arranged. The (2-1) auxiliary line DL-C2a, the (2-2) auxiliary line DL-C2b, and the (2-3) auxiliary line DL-C2c may be spaced apart from each other and be alternately arranged in the ±x directions.

Figure 9B:
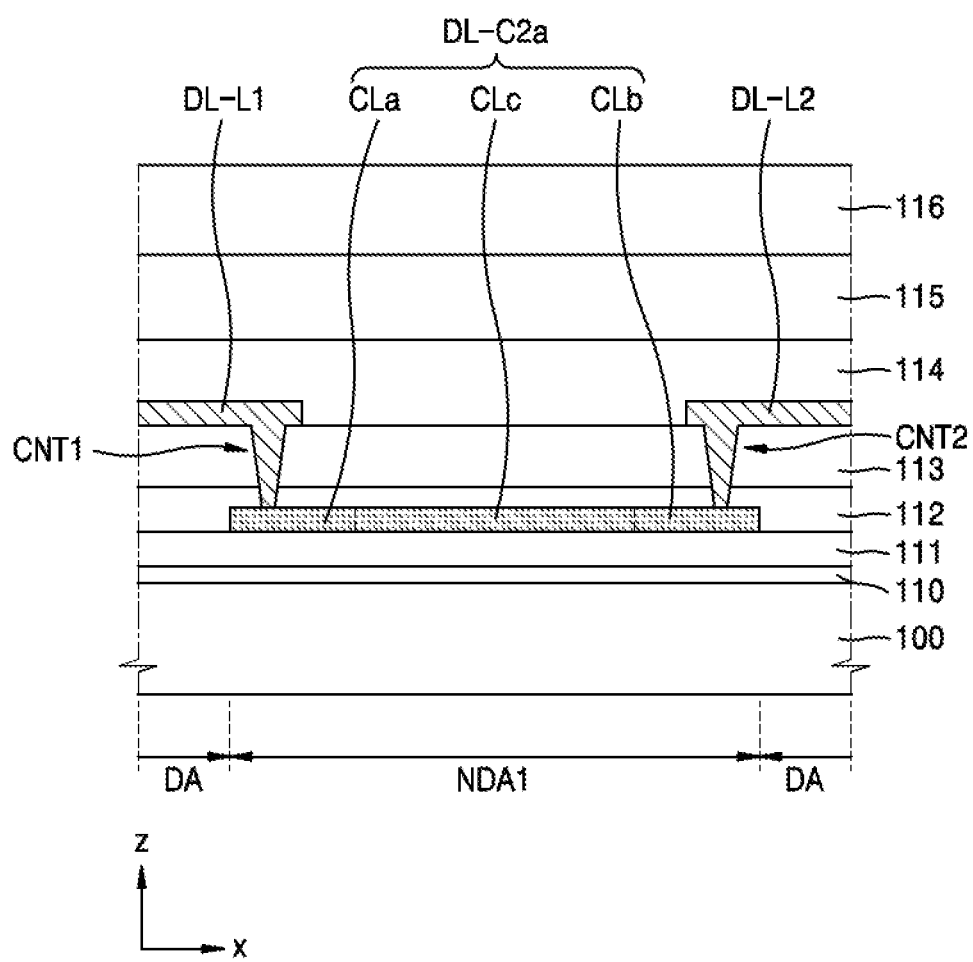

FIG. 9B is a cross-sectional view of the (2-1) auxiliary line DL-C2a. As shown in FIG. 9B, the first data line DL-L1 and the second data line DL-L2 may be arranged on the third insulating layer 113, and the (2-1) auxiliary line DL-C2a may be arranged on the first insulating layer 111. A first portion CLa of the (2-1) auxiliary line DL-C2a may be electrically connected to the first data line DL-L1 through a first via contact CNT1 formed in the second insulating layer 112 and the third insulating layer 113. A second portion CLb of the (2-1) auxiliary line DL-C2a may be electrically connected to the second data line DL-L2 through a second via contact CNT2 formed in the second insulating layer 112 and the third insulating layer 113. The (2-1) auxiliary line DL-C2a may include the same material as that of the gate electrode GE (see FIG. 7) of the thin film transistor TFT.

In FIG. 9B, the (2-1) auxiliary line DL-C2a is electrically connected to the first data line DL-L1 and the second data line DL-L2 by directly contacting the first data line DL-L1 and the second data line DL-L2. In an exemplary embodiment, connection electrodes are respectively provided between the (2-1) auxiliary line DL-C2a and the first data line DL-L1, and between the (2-1) auxiliary line DL-C2a and the second data line DL-L2 (for example, between the second insulating layer 112 and the third insulating layer 113). Since the (2-1) auxiliary line DL-C2a, the first data line DL-L1, and the second data line DL-L2 are electrically connected to the connection electrode, the (2-1) auxiliary line DL-C2a may electrically connect the first data line DL-L1 to the second data line DL-L2.

Figure 9C:
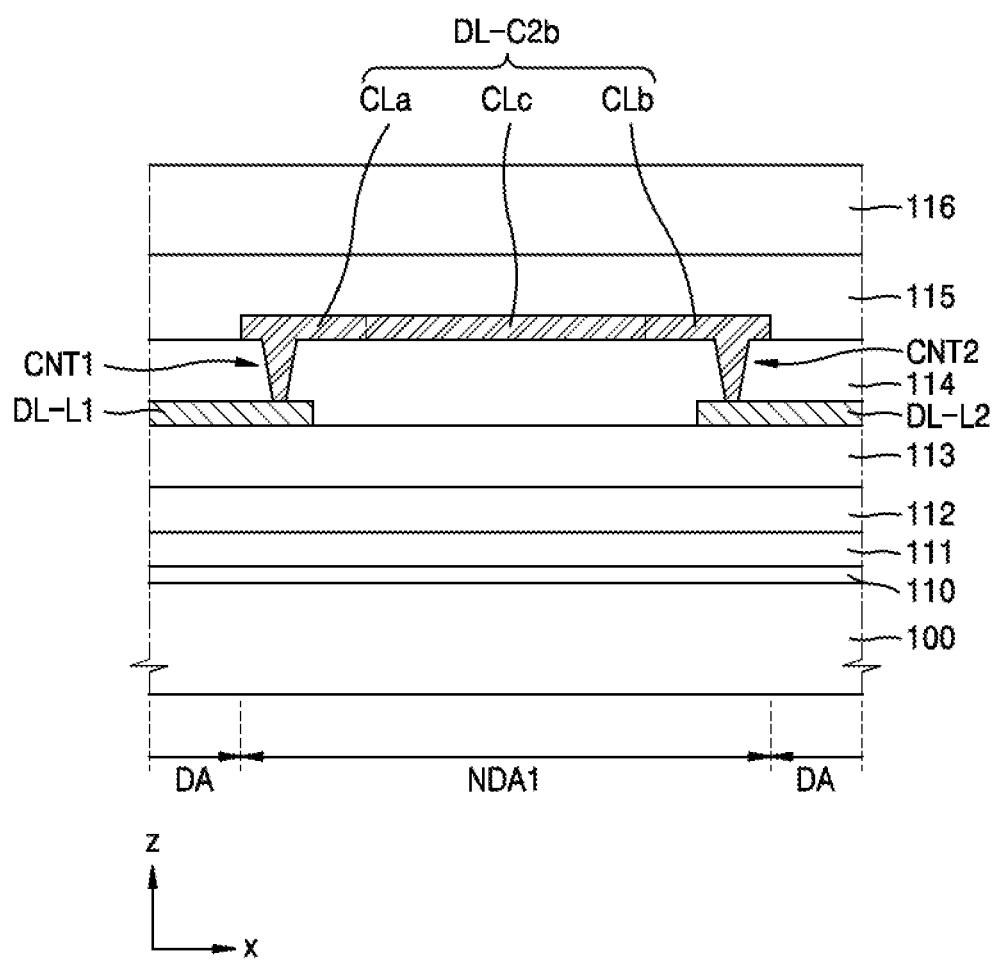

FIG. 9C is a cross-sectional view of the (2-2) auxiliary line DL-C2b. As shown in FIG. 9C, the first data line DL-L1 and the second data line DL-L2 may be arranged on the third insulating layer 113, and the (2-2) auxiliary line DL-C2b may be arranged on the fourth insulating layer 114. A first portion CLa of the (2-2) auxiliary line DL-C2b may be electrically connected to the first data line DL-L1 through a first via contact CNT1 formed in the fourth insulating layer 114. A second portion CLb of the (2-2) auxiliary line DL-C2b may be electrically connected to the second data line DL-L2 through a second via contact formed in the fourth insulating layer 114. The (2-2) auxiliary line DL-C2b may include the same material as that of the connection electrode CM (see FIG. 7).

Figure 9D:
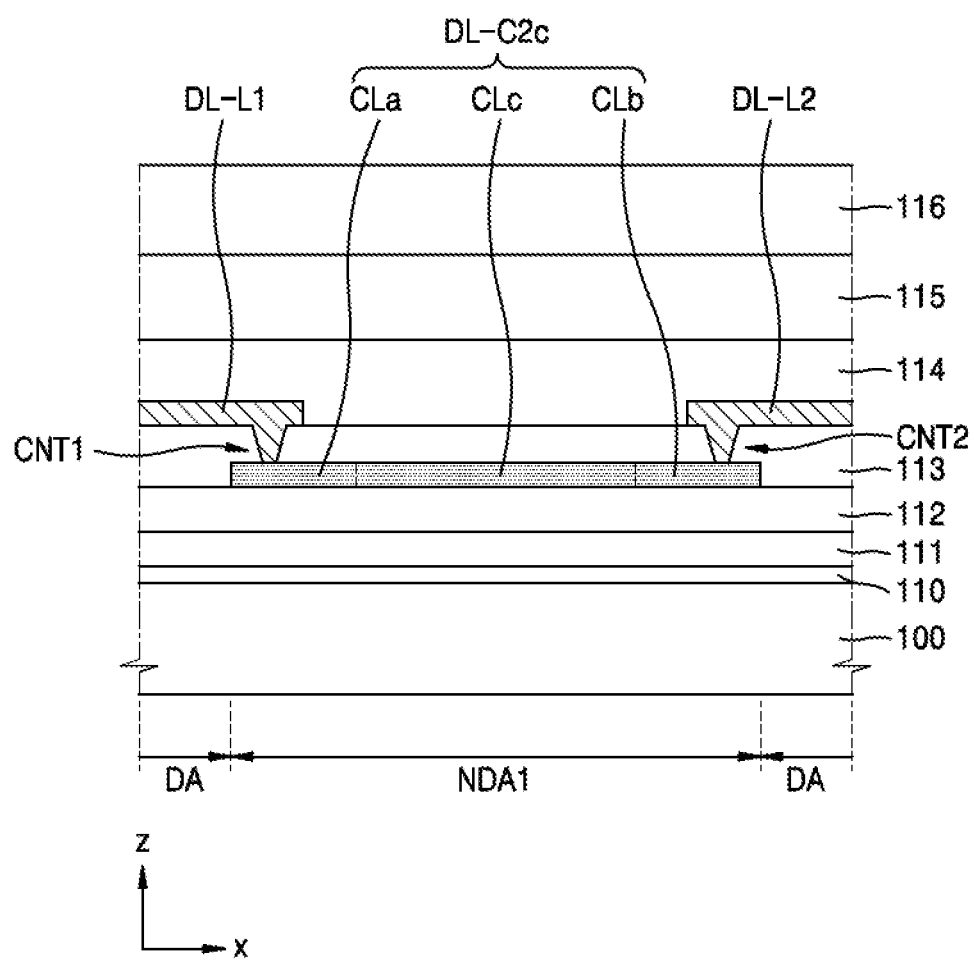

FIG. 9D is a cross-sectional view of the (2-3) auxiliary line DL-C2c. As shown in FIG. 9D, the first data line DL-L1 and the second data line DL-L2 may be arranged on the third insulating layer 113, and the (2-3) auxiliary line DL-C2c may be arranged on the second insulating layer 112. A first portion CLa of the (2-3) auxiliary line DL-C2c may be electrically connected to the first data line DL-L1 through a first via contact CNT1 formed in the third insulating layer 113. A second portion CLb of the (2-3) auxiliary line DL-C2c may be electrically connected to the second data line DL-L2 through a second via contact CNT2 formed in the third insulating layer 113. The (2-3) auxiliary line DL-C2c may include the same material as that of the top electrode CE2 (see FIG. 7) of the capacitor Cst.

As shown in FIGS. 9B to 9D, the first data line DL-L1 and the second data line DL-L2 may be arranged on the third insulating layer 113, and the second auxiliary lines DL-C2 may be arranged on the first insulating layer 111, the second insulating layer 112, or the fourth insulating layer 114 and directly connected to the first data line DL-L1 and the second data line DL-L2 through via contacts, or connected to the first data line DL-L1 and the second data line DL-L2 by a connection electrode. In an exemplary embodiment, the first data line DL-L1 and the second data line DL-L2 may be arranged on the fourth insulating layer 114, and the second auxiliary lines DL-C2 may be arranged on the first insulating layer 111, the second insulating layer 112, or the third insulating layer 113 and directly connected to the first data line DL-L1 and the second data line DL-L2 through via contacts, or connected to the first data line DL-L1 and the second data line DL-L2 by a connection electrode.

Figure 10:
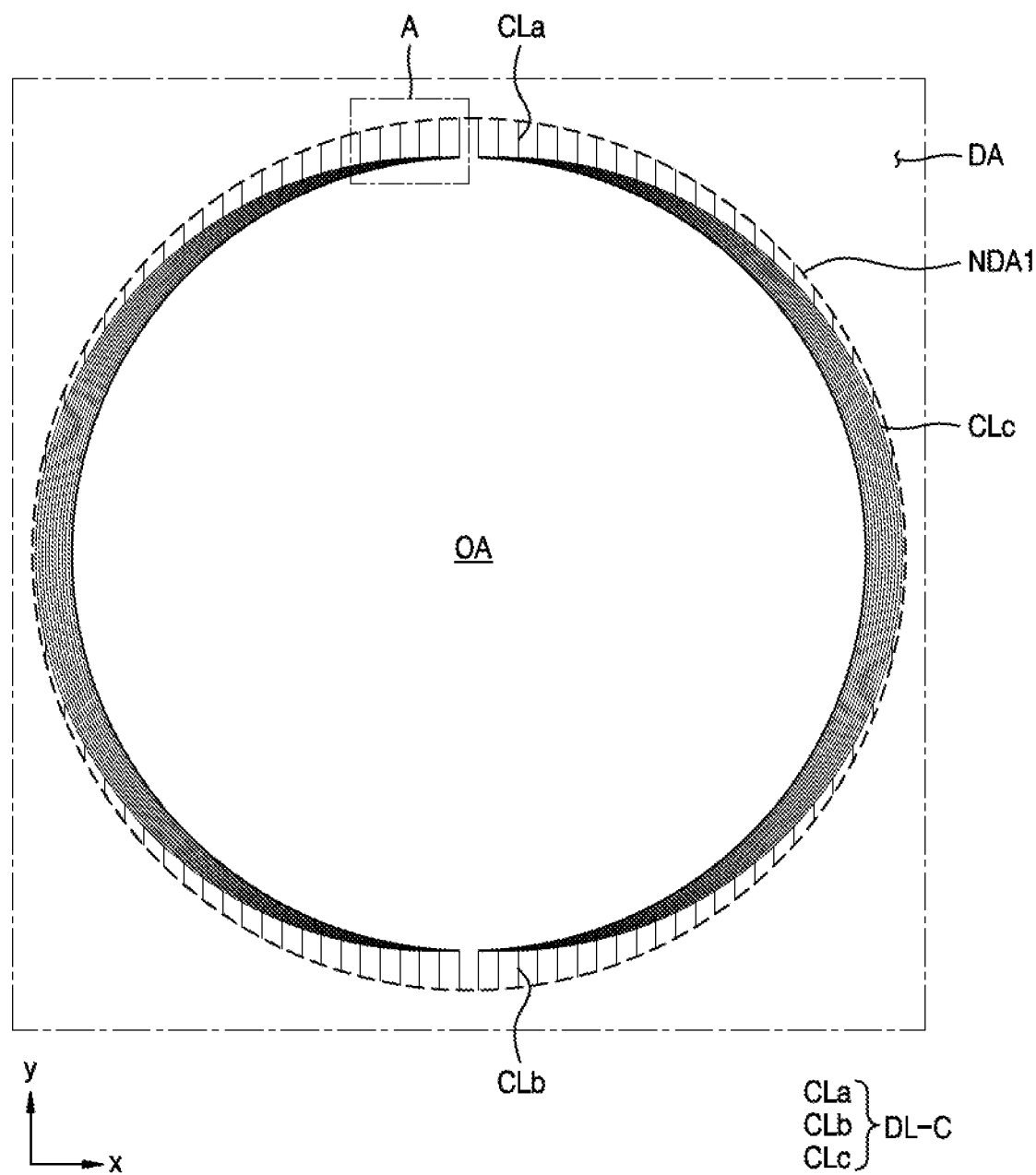
FIG. 10 is a plan view of auxiliary lines arranged in a first non-display area according to an exemplary embodiment.
Figure 11:
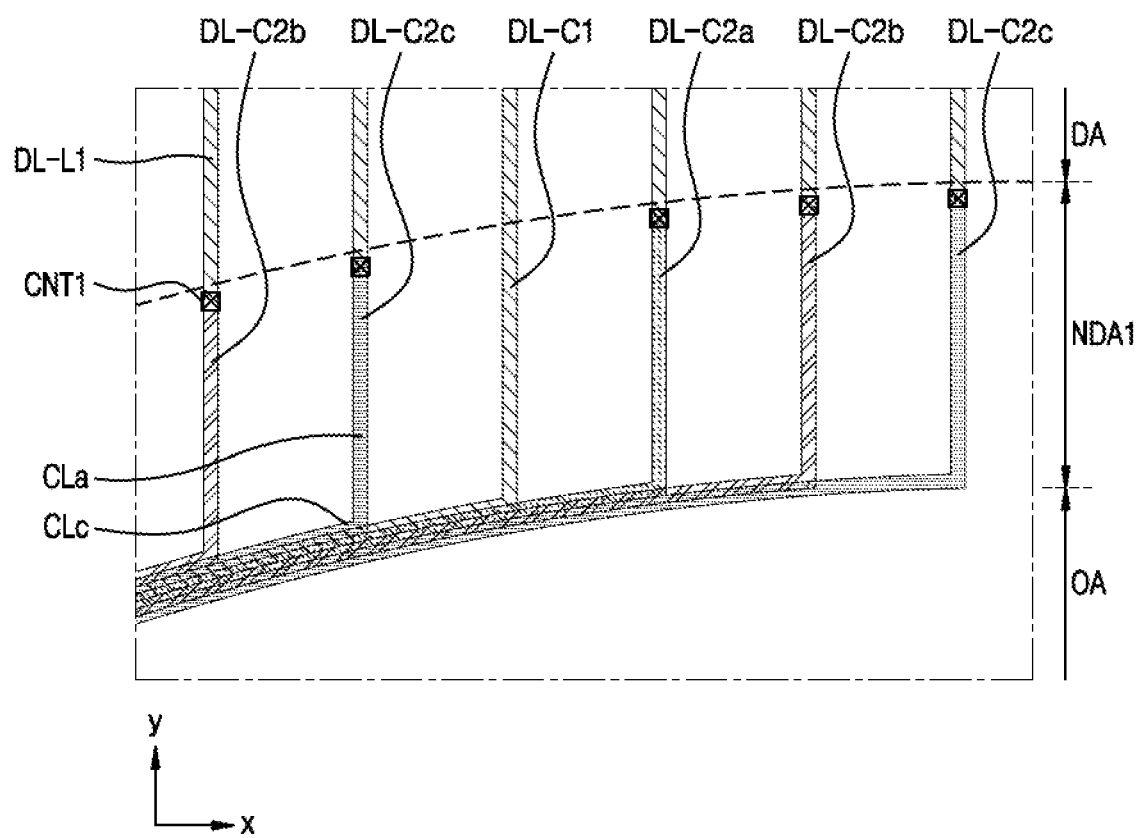
FIG. 11 is an enlarged plan view of a region A of FIG. 10 according to an exemplary embodiment.

FIG. 10 is a plan view of auxiliary lines arranged in a first non-display area according to an embodiment, and FIG. 11 is an enlarged plan view of a region A of FIG. 10.

As shown in FIG. 10, the auxiliary lines DL-C may extend along an arc of the component area OA. The auxiliary lines DL-C that are adjacent to each other may be arranged on different layers and overlap each other. For example, first portions CLa and second portions CLb of the auxiliary lines DL-C may be spaced apart from each other and opposite to each other with the component area OA therebetween. Third portions CLc of the auxiliary lines DL-C that are adjacent to each other may be arranged on different layers and overlap each other.

As shown in FIG. 11, third portions CLc of the first and second auxiliary lines DL-C1, DL-C2a, DL-C2b, and DL-C2c may be arranged on different layers. Two adjacent third portions of the third portions CLc may partially overlap each other. Therefore, in a high resolution-display device, an area of the first non-display area NDA1 required for the arrangement of the first auxiliary line DL-C1 and the second auxiliary lines DL-C2a, DL-C2b, and DL-C2c may be minimized.

Figure 12:
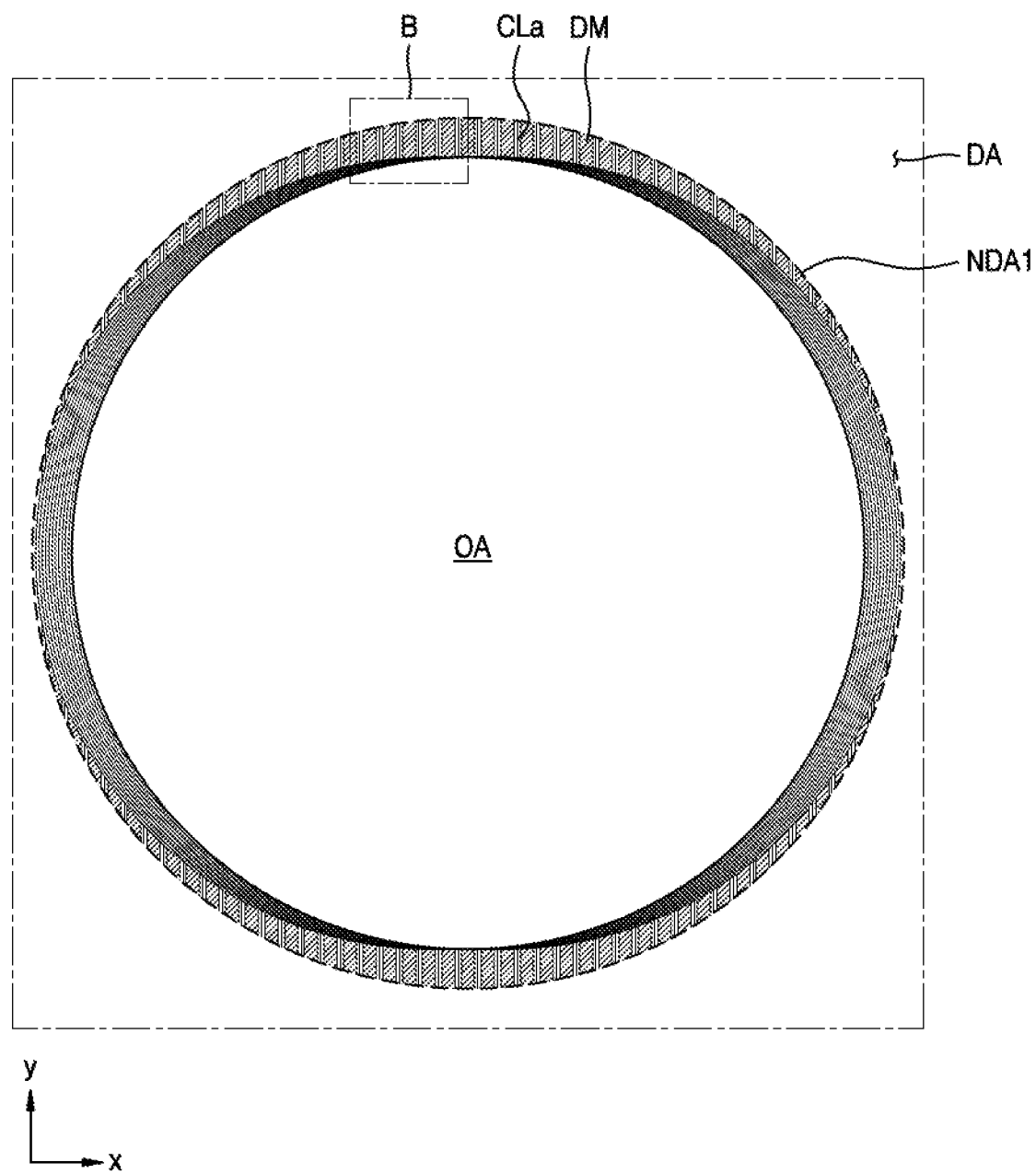
FIG. 12 is a plan view of auxiliary lines arranged in the first non-display area according to an exemplary embodiment.
Figure 13:
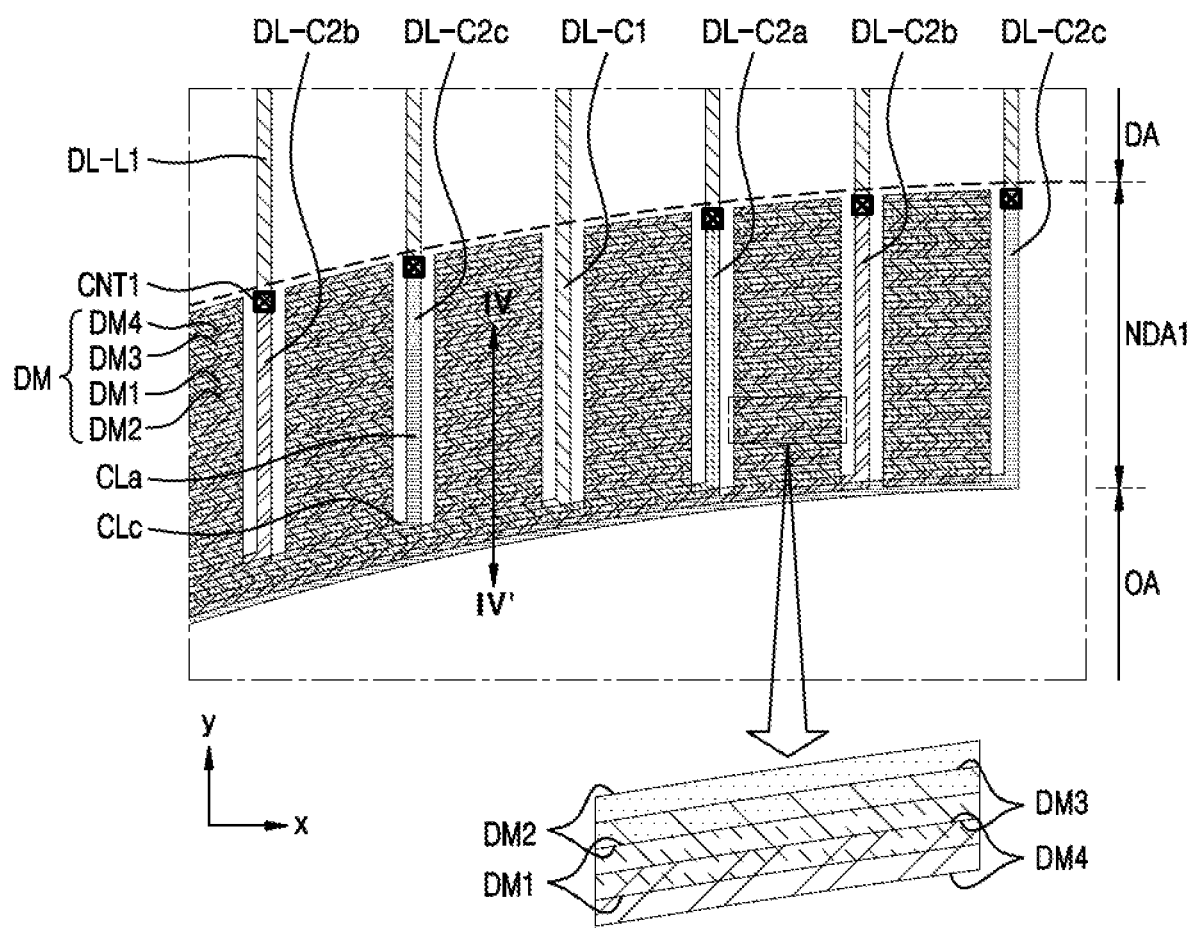
FIG. 13 is an enlarged plan view of a region B of FIG. 12 according to an exemplary embodiment.
Figure 14:
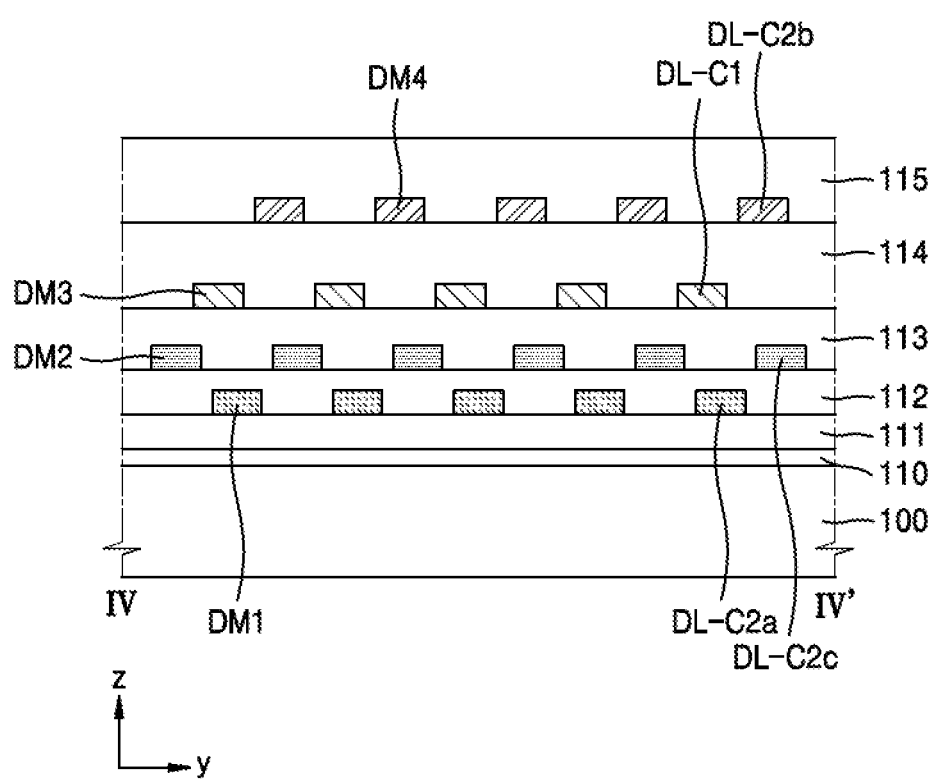
FIG. 14 is a cross-sectional view of the region B of FIG. 13 taken along line IV-IV' according to an exemplary embodiment.

FIG. 12 is a plan view of auxiliary lines arranged in the first non-display area NDA1 according to an exemplary embodiment. FIG. 13 is an enlarged plan view of a region B of FIG. 12. FIG. 14 is a cross-sectional view of the region B taken along line IV-IV' of FIG. 13.

Referring to FIG. 12, patterns DM may be arranged between the auxiliary lines DL-C in the first non-display area NDA1. The patterns DM may be arranged in an island type between first portions CLa of the auxiliary lines DL-C that are adjacent to each other and between second portions CLb of the auxiliary lines DL-C that are adjacent to each other.

Referring to FIG. 13, the patterns DM may include first patterns DM1, second patterns DM2, third patterns DM3, and fourth patterns DM4 arranged on different layers. The first to fourth patterns DM1, DM2, DM3, and DM4 may be spaced apart from the auxiliary lines DL-C between the first portions CLa of the auxiliary lines DL-C. Similarly, the first to fourth patterns DM1, DM2, DM3, and DM4 may be spaced apart from the auxiliary lines DL-C between the second portions CLb of the auxiliary lines DL-C. Each of the first to fourth patterns DM1, DM2, DM3, and DM4 may have a rectangular shape having two pairs of sides opposite to each other. A pair of first sides of the first to fourth patterns DM1, DM2, DM3, and DM4 may be rounded with a curvature corresponding to the curvature of the auxiliary line DL-C. A pair of second sides may be spaced apart by a predetermined interval between two adjacent first portions CLa or two adjacent second portions CLb of the auxiliary lines DL-C.

The patterns DM may include a conductive material. The patterns DM may include the same material as that of at least one of the auxiliary lines DL-C. Referring to FIG. 14, the first patterns DM1 and the (2-1) auxiliary line DL-C2a may be arranged on the same layer (e.g., the first insulating layer 111), and may include the same material. The second patterns DM2 and the (2-3) auxiliary line DL-C2c may be arranged on the same layer (e.g., the second insulating layer 112), and may include the same material. The third pattern DM3 and the first auxiliary line DL-C1 may be arranged on the same layer (e.g., the third insulating layer 113) and may include the same material. The fourth pattern DM4 and the (2-2) auxiliary line DL-C2b may be arranged on the same layer (e.g., the fourth insulating layer 114) and may include the same material. The patterns DM on the same layer may be spaced apart from each other, and the patterns DM on different layers may partially overlap each other. For example, the patterns DM on an upper layer may partially overlap at least one of the patterns DM on a lower layer.

Referring to FIG. 14, the (2-1) auxiliary lines DL-C2a and the first patterns DM1 may be spaced apart from each other on the first insulating layer 111. The (2-3) auxiliary lines DL-C2c and the second patterns DM2 may be spaced apart from each other on the second insulating layer 112. The second patterns DM2 may not overlap the first patterns DM1. For example, each of the second patterns DM2 may be arranged between two adjacent first patterns DM1 in a top down view. The first auxiliary lines DL-C1 and the third patterns DM3 may be spaced apart from each other on the third insulating layer 113. Each of the third patterns DM3 may partially overlap the first pattern DM1 and/or the second pattern DM2. The (2-2) auxiliary lines DL-C2b and the fourth patterns DM4 may be spaced apart from each other on the fourth insulating layer 114. The fourth patterns DM4 may not overlap the third patterns DM3. Each of the fourth patterns DM4 may partially overlap the first pattern DM1 and/or the second pattern DM2.

As shown in FIG. 12, the wiring density of the auxiliary lines DL-C in the ±x directions in the first non-display area NDA1 is greater than the wiring density of the auxiliary lines DL-C in the ±y directions in the first non-display area NDA1. Since the third portions CLc of the auxiliary lines DL-C arranged on different layers overlap each other, a step difference may occur in the first non-display area NDA1. For example, a thickness from a top surface of the substrate to a top surface of an uppermost insulating layer (e.g. the fifth insulating layer 115) in a region in which the third portions CLc of the auxiliary lines DL-C are arranged may be greater than a thickness from the top surface of the substrate to a top surface of an uppermost insulating layer in a region in which the first portion CLa and the second portion CLb are arranged. Therefore, a portion (a boundary between the first portion CLa and the third portion CLc) in which the first portion CLa of the auxiliary line DL-C is connected to the third portion CLc, and a portion (a boundary between the second portion CLb and the third portion CLc) in which the second portion CLb of the auxiliary line DL-C is connected to the third portion CLc may have a thin thickness. The auxiliary line DL-C is bent at the connection between the first portion CLa and the third portion CLc. The auxiliary line DL-C is also bent at the connection between the second portion CLb and the third portion CLc.

In an embodiment, since the first to fourth patterns DM1, DM2, DM3, and DM4 are arranged between the first portions CLa of the auxiliary lines DL-C and between the second portions CLb of the auxiliary lines DL-C, the wiring density in the ±y directions of the first non-display area NDA1 is approximated to the wiring density in the ±x directions, and a step difference of the insulating layer in the first non-display area NDA1 may be minimized. Since the step difference of the insulating layer is minimized at the boundary between the first portion CLa and the third portion CLc of the auxiliary line DL-C and the boundary between the second portion CLb and the third portion CLc of the auxiliary line DL-C, the width of the third portion CLc may be maintained constant without the reduction of the width of the third portion CLc. Therefore, the disconnection of the auxiliary line CL-C in the first non-display area NDA1 may be prevented.

The arrangement of the patterns DM in FIGS. 13 and 14 is provided as an example, and the number of patterns DM, whether the patterns DM overlap each other, and an overlapping degree may be changed.

Figure 15:
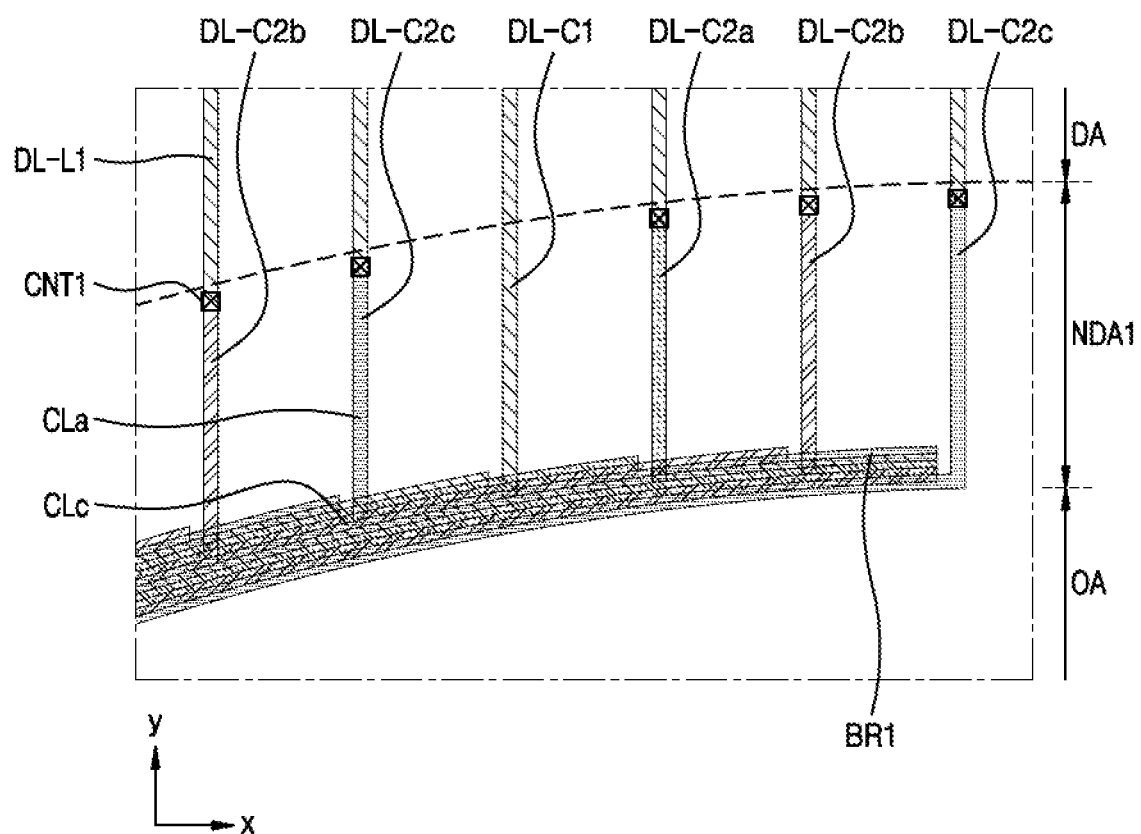
FIG. 15 is an enlarged plan view of a region corresponding to the region B of FIG. 12 according to an exemplary embodiment.
Figure 16A:
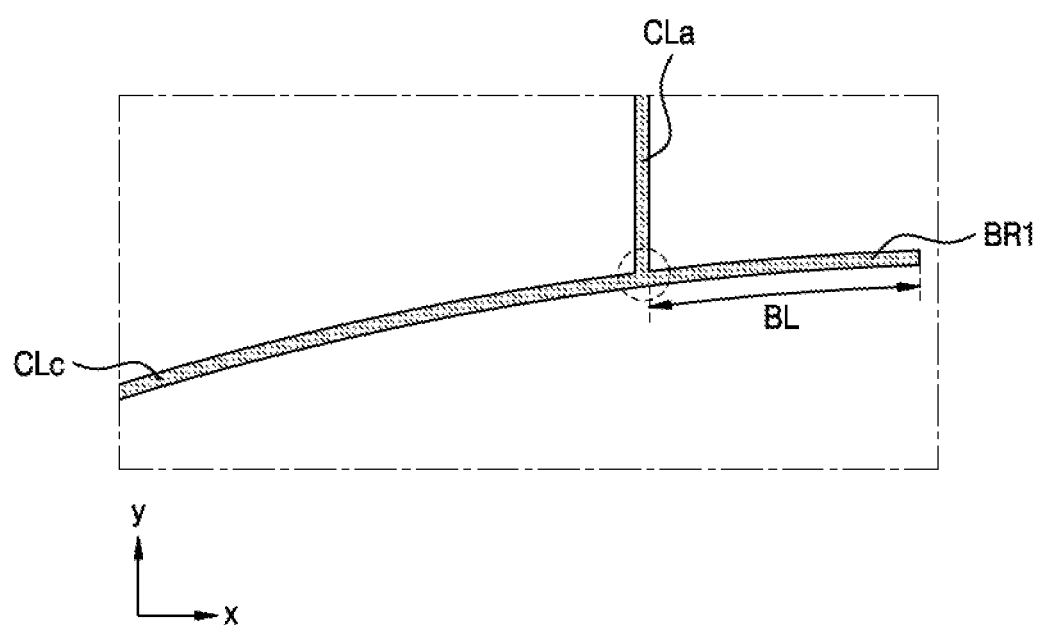
FIGS. 16A and 16B are enlarged view of an arbitrary auxiliary line of FIG. 15 according to an exemplary embodiment.
Figure 16B:
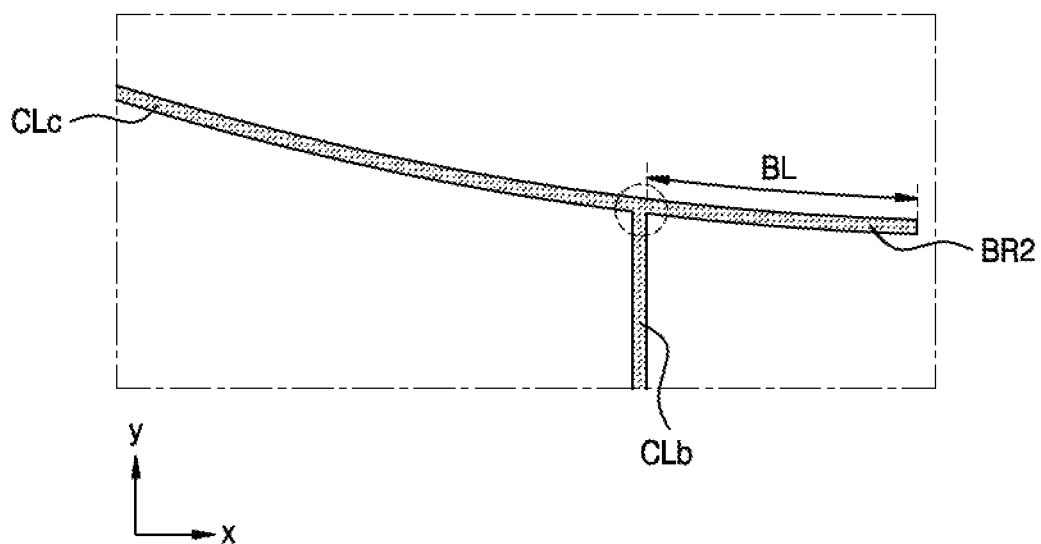
Figure 17:
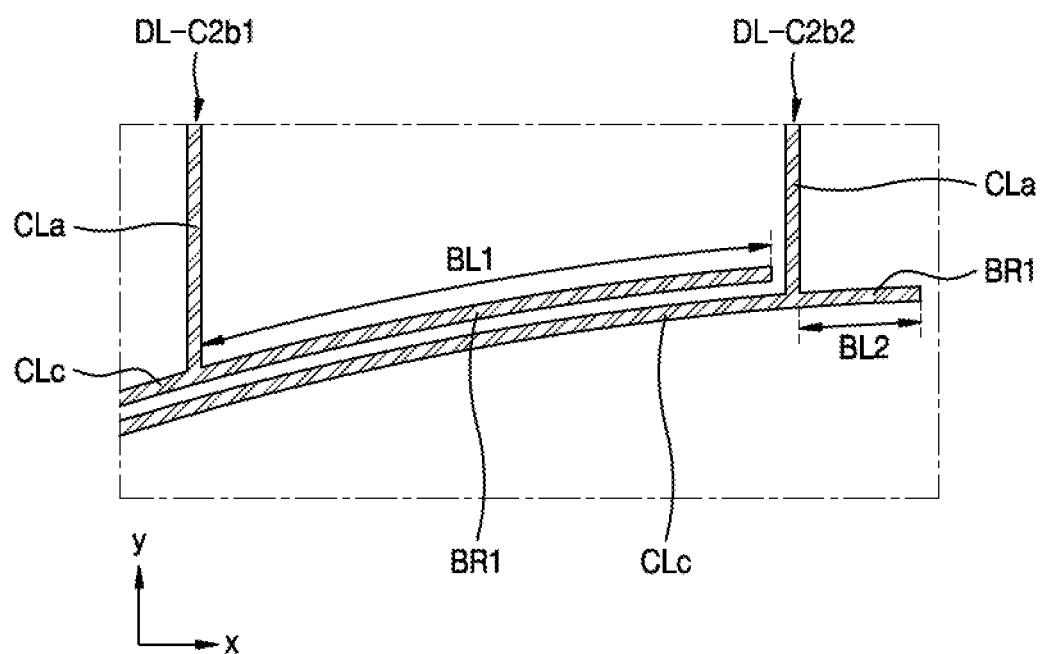
FIG. 17 is an enlarged plan view of a (2-2) auxiliary line of FIG. 15 according to an exemplary embodiment.

FIG. 15 is an enlarged plan view of a region corresponding to the region B of FIG. 12 according to an exemplary embodiment. FIGS. 16A and 16B are enlarged views of an arbitrary auxiliary line of FIG. 15, and FIG. 17 is an enlarged plan view of a (2-2) auxiliary line of FIG. 15.

Referring to FIGS. 15 and 16A, each of the first and second auxiliary lines DL-C1 and DL-C2 may further include a branch BR protruding from a respective one of the first and second auxiliary lines DL-C1, DL-C2a, DL-C2b, and DL-C2c. The branch BR may include a first branch BR1 and a second branch BR2, the first branch BR1 extending from one end of the third portion CLc of each of the first and second auxiliary lines DL-C1 and DL-C2, and the second branch BR2 extending from another end of the third portion CLc. The first branch BR1 and the second branch BR2 may protrude from the third portion CLc in an extending direction of the third portion CLc. Each of the first and second auxiliary line DL-C1, DL-C2a, DL-C2b, and DL-C2c may include the first branch BR1 and/or the second branch BR2.

As shown in FIG. 16A, the first branch BR1 may include a portion extending in a direction (a clockwise direction) opposite to an extension direction (a counterclockwise direction) of the third portion CLc at a portion where the first portion CLa of the auxiliary line is connected to the third portion CLc. As shown in FIG. 16B, the second branch BR2 may include a portion extending in an extension direction (a counterclockwise direction) of the third portion CLc at a portion where the third portion CLc of the auxiliary line is connected to the second portion CLb.

Since the branch BR extends between first portions or second portions of other auxiliary lines adjacent thereto, similarly to the patterns DM shown in FIG. 12, the branch BR may minimize a step difference of the insulating layer in the first non-display area NDA1.

The branch BR of the auxiliary line DL-C may extend in an arc direction of the component area OA. The branch BR of the auxiliary line DL-C may cross first portions CLa or second portions CLb of other auxiliary lines arranged on different layers.

The first branch BR1 of the auxiliary line DL-C may extend from the third portion CLc without contacting or crossing the first portion CLa of the another auxiliary line arranged on the same layer. For example, in FIG. 15, a branch of the (2-3) auxiliary line DL-C2c positioned in the second from the left in the drawing may cross first portions CLa of the first auxiliary line DL-C1, the (2-1) auxiliary line DL-C2a, and the (2-2) auxiliary line DL-C2b that are spaced apart from each other in the +x direction and extend in the clockwise direction, and may be spaced apart with an interval from a first portion CLa of the (2-3) auxiliary line DL-C2c arranged on the same layer on the rightmost side without contacting or crossing the first portion CLa of the (2-3) auxiliary line DL-C2c. Likewise, the second branch BR2 of the auxiliary line DL-C may extend in the counterclockwise direction from the third portion CLc without contacting or crossing the second portion CLb of the another auxiliary line arranged on the same layer.

The branch BR of the auxiliary line DL-C may have a length less than an interval between (n+1) data lines, where n is an integer equal to or greater than 2 and may be the number of connection lines arranged on different layers. For example, as shown in FIG. 15, in the case where four connection lines arranged on different layers are repeatedly arranged in the first non-display area NDA1, n may be 4.

The lengths of the branches BR of the auxiliary lines DL-C may be the same or different from each other. For example, as shown in FIG. 15, the length of the first branch BR1 of the (2-3) auxiliary line DL-C2c in the second from the left of the drawing may be less than an interval between five data lines. The length of the first branch BR1 of the first auxiliary line DL-C1 may be less than an interval between four data lines. The length of the first branch BR1 of the (2-1) auxiliary line DL-C2a may be less than an interval between three data lines. The length of the first branch BR1 of the (2-2) auxiliary line DL-C2b may be less than an interval between two data lines.

The lengths of the branches BR of the auxiliary lines DL-C arranged on the same layer may be the same or different from each other. As shown in FIG. 17, a first length BL1 of the first branch BR1 of the (2-2) auxiliary line DL-C2b1 on the left is greater than a second length BL2 of the first branch BR1 of the (2-2) auxiliary line DL-C2b2 on the right. The first length BL1 may be less than an interval between five data lines. The second length BL2 may be less than an interval between two data lines.

Some of the auxiliary lines DL-C may not include the branch BR. In FIG. 15, the (2-3) auxiliary line DL-C2c on the rightmost side does not include the branch BR. An auxiliary line that does not include the branch BR may be an auxiliary line of which a first portion, if extending along a lengthwise direction thereof, extends toward the center of the component area OA or toward the near of the center.

Figure 18:
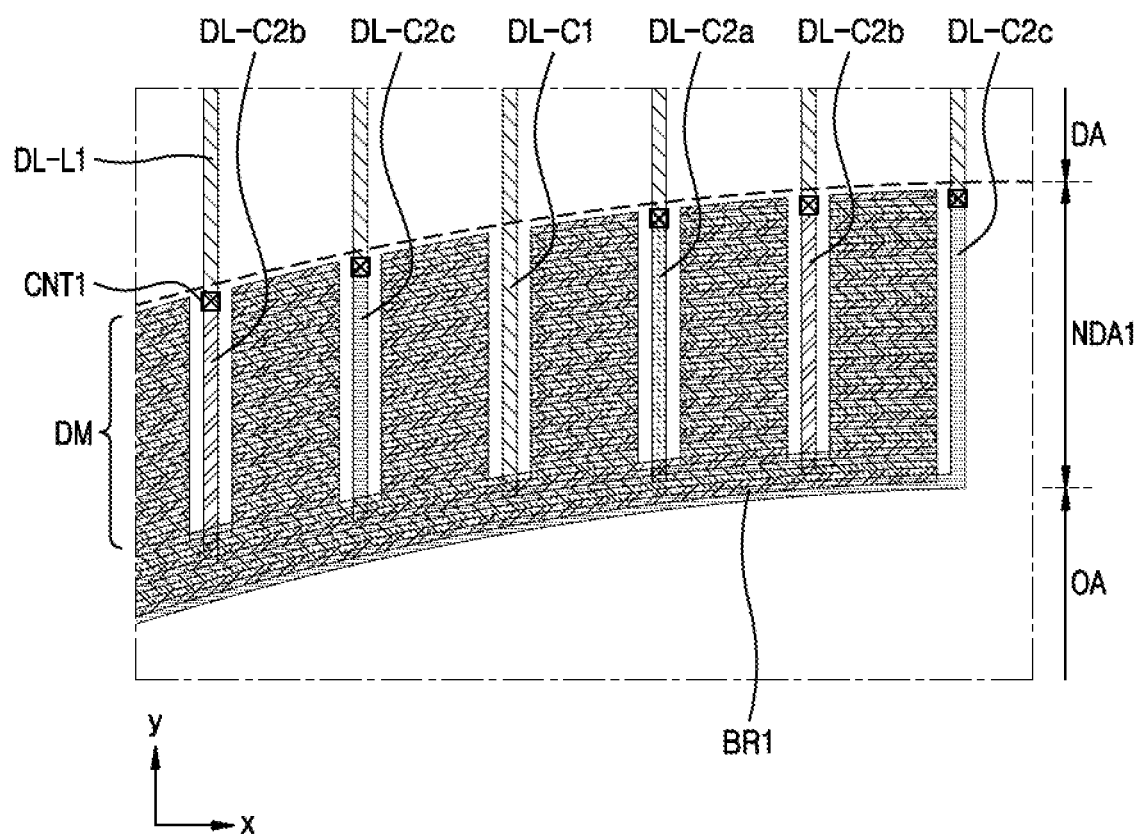
FIG. 18 is an enlarged plan view of a region corresponding to the region B of FIG. 12 according to an exemplary embodiment.

FIG. 18 is an enlarged plan view of a region corresponding to the region B of FIG. 12 according to an exemplary embodiment.

The embodiment shown in FIG. 18 is an example that employs both the embodiment shown in FIG. 13 and the embodiment shown in FIG. 15. For example, the branches BR and the patterns DM may be arranged between the first portions CLa and the second portions CLb of the auxiliary lines DL-C, the branches BR protruding from the auxiliary lines DL-C.

Though the above embodiments describe the four auxiliary lines DL-C arranged on different layers as an example, the embodiments are not limited thereto. For example, two or three auxiliary lines arranged on different layers may be arranged in the first non-display area NDA1 to connect the first data line to the second data line in the display area DA. In addition, to match up, down, left, and right wiring densities in the first non-display area NDA1, conductive patterns may be arranged between the first portions and the second portions of the auxiliary lines arranged along the edge of the component area OA, and/or a branch protruding from the third portion of the auxiliary lines may be formed. In the case where two auxiliary lines are used, two conductive patterns may be repeatedly arranged, and in the case where three auxiliary lines are used, three conductive patterns may be repeatedly arranged.

The embodiments may provide the display device in which reliability increases and the non-display area is reduced. This effect is provided as an example and the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a substrate including a transmission area, a display area, and a first non-display area, the display area surrounding the transmission area, and the first non-display area being between the transmission area and the display area;
   a first display element and a second display element arranged apart from each other in the display area with the transmission area therebetween;
   a first data line extending in a first direction, arranged in the display area, and connected to the first display element;
   a second data line extending in the first direction, arranged in the display area, and connected to the second display element;
   a first auxiliary line arranged in the first non-display area and connecting the first data line to the second data line;
   a second auxiliary line arranged in the first non-display area and adjacent to the first auxiliary line;
   a plurality of patterns arranged between the first auxiliary line and the second auxiliary line in the first non-display area and spaced apart from each of the first auxiliary line and the second auxiliary line.

2. The display device of claim 1,
   wherein each of the plurality of patterns includes a conductive material.

3. The display device of claim 1,
   wherein each of the first auxiliary line and the second auxiliary line includes a first portion, a second portion, and a third portion, the first portion and the second portion being parallel to the first direction, and the third portion connecting the first portion to the second portion and extending along an edge of the transmission area,
   wherein the first portion is connected to the first data line, and the second portion is connected to the second data line,
   wherein the plurality of patterns are arranged around the first portion and the second portion.

4. The display device of claim 3,
   wherein the first auxiliary line is arranged on a different layer from the second auxiliary line adjacent to the first auxiliary line, and
   wherein a third portion of the first auxiliary line partially overlaps a third portion of the second auxiliary line.

5. The display device of claim 4,
wherein the first auxiliary line further includes a branch extending from a connection between the first portion and the third portion and along an extending direction of the third portion.

6. The display device of claim 5,
wherein the branch of the first auxiliary line overlaps a first portion of the second auxiliary line or a second portion thereof and extends along the edge of the transmission area.

7. The display device of claim 3,
wherein the plurality of patterns are arranged in an island type between the first portions of the first auxiliary line and the second auxiliary line and between the second portions of the first auxiliary line and the second auxiliary line, in a plan view.

8. The display device of claim 1,
wherein the plurality of patterns and the first auxiliary line are arranged on the same layer, and
wherein the plurality of patterns and the first auxiliary line include the same material.

9. The display device of claim 1,
wherein the first auxiliary line, the first data line and the second data line are formed as one body.

10. The display device of claim 1,
wherein the first auxiliary line is arranged on a layer different from a layer on which the first data line and the second data line are arranged, and
wherein the first auxiliary line is electrically connected to the first data line and the second data line.

11. The display device of claim 10,
wherein the first auxiliary line is arranged below the first data line and the second data line with an insulating layer therebetween.

12. The display device of claim 10,
wherein the first auxiliary line is arranged over the first data line and the second data line with an insulating layer therebetween.

13. The display device of claim 1,
wherein each of the first display element and the second display element includes a first electrode, a second electrode, and an emissions layer,
wherein the second electrode is spaced apart from the first electrode, and
wherein the emission layer is interposed between the first electrode and the second electrode.

14. The display device of claim 13, further comprising:
a first thin film transistor connected to the first electrode of the first display element; and
a second thin film transistor connected to the first electrode of the second display element.

15. The display device of claim 14,
wherein the first auxiliary line and a gate electrode of the first thin film transistor are arranged on the same layer, and includes the same material.

16. The display device of claim 14, further comprising:
an electrode layer overlapping a gate electrode of the first thin film transistor and is arranged over the gate electrode, and
wherein the first auxiliary line and the electrode layer are arranged on the same layer and includes the same material.

17. The display device of claim 14, further comprising:
a connection electrode electrically connected to a semiconductor layer of the first thin film transistor and arranged below the first electrode of the first display element,
wherein an insulating layer is interposed between the connection electrode and the first electrode of the first display element, and
wherein the first auxiliary line and the connection electrode are arranged on the same layer and includes the same material.

18. A display device comprising:
a substrate including a transmission area, a display area, and a first non-display area, the display area surrounding the transmission area, and the first non-display area being between the transmission area and the display area;
a first display element and a second display element arranged apart from each other in the display area with the transmission area therebetween;
a first data line extending in a first direction, arranged in the display area, and connected to the first display element;
a second data line extending in the first direction, arranged in the display area, and connected to the second display element; and
a first auxiliary line arranged in the first non-display area and connecting the first data line to the second data line,
wherein the first auxiliary line includes a first portion, a second portion, a third portion, and a first branch, the first portion and the second portion being parallel to the first direction, the third portion connecting the first portion to the second portion and extending along an edge of the transmission area, and the first branch extending from a first end of the third portion that is connected to the first portion and extending along an edge of the transmission area in a first extending direction that extends away from the first end of the third portion.

19. The display device of claim 18,
wherein the first auxiliary line is arranged on a different layer from a second auxiliary line adjacent to the first auxiliary line, and
wherein the third portion of the first auxiliary line partially overlaps a portion of the second auxiliary line.

20. The display device of claim 19,
wherein the first branch of the first auxiliary line overlaps a first portion of the second auxiliary line or a second portion thereof,
wherein the first branch extends along the edge of the transmission area, and
wherein the portion of the second auxiliary line connects the first portion thereof to the second portion thereof.

21. The display device of claim 18,
wherein the first auxiliary line further includes a second branch extending from a second end of the third portion that is connected to the second portion,
wherein the second branch extends in the first extending direction and the first branch extends in a second extending direction, opposite to the first extending direction.

22. The display device of claim 18,
wherein the first portion, the third portion, and the first branch are in a same layer so that the first end of the third portion is directly connected to the first portion and the first branch.

* * * * *